(12) United States Patent
Mehrotra et al.

(10) Patent No.: US 8,712,783 B2
(45) Date of Patent: *Apr. 29, 2014

(54) ENTROPY ENCODING AND DECODING USING DIRECT LEVEL AND RUN-LENGTH/LEVEL CONTEXT-ADAPTIVE ARITHMETIC CODING/DECODING MODES

(75) Inventors: Sanjeev Mehrotra, Kirkland, WA (US); Wei-Ge Chen, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 223 days.

This patent is subject to a terminal disclaimer.

(21) Appl. No.: 13/306,761

(22) Filed: Nov. 29, 2011

(65) Prior Publication Data

US 2012/0069899 A1 Mar. 22, 2012

Related U.S. Application Data

(60) Continuation of application No. 12/907,848, filed on Oct. 19, 2010, now Pat. No. 8,090,574, which is a continuation of application No. 12/127,707, filed on May 27, 2008, now Pat. No. 7,840,403, which is a division of application No. 10/647,923, filed on Aug. 25, 2003, now Pat. No. 7,433,824.

(60) Provisional application No. 60/408,538, filed on Sep. 4, 2002.

(51) Int. Cl.
*G10L 19/02* (2013.01)
*H03M 7/46* (2006.01)
*H03M 7/48* (2006.01)

(52) U.S. Cl.
USPC ............... 704/500; 704/501; 341/51; 341/56

(58) Field of Classification Search
CPC ..... G10L 19/00; G10L 19/0017; H03M 7/46; H03M 7/48
USPC .............. 704/205, 500, 501; 341/56, 59, 51
See application file for complete search history.

(56) References Cited

U.S. PATENT DOCUMENTS

| | | |
|---|---|---|
| 4,420,771 A | 12/1983 | Pirsch |
| 4,698,672 A | 10/1987 | Chen |

(Continued)

FOREIGN PATENT DOCUMENTS

| | | |
|---|---|---|
| EP | 0540350 | 5/1993 |
| EP | 0910927 | 1/1998 |

(Continued)

OTHER PUBLICATIONS

U.S. Appl. No. 60/341,674, filed Dec. 17, 2001, Lee et al.

(Continued)

*Primary Examiner* — Martin Lerner
(74) *Attorney, Agent, or Firm* — Aaron Chatterjee; Andrew Sanders; Micky Minhas

(57) ABSTRACT

An encoder performs context-adaptive arithmetic encoding of transform coefficient data. For example, an encoder switches between coding of direct levels of quantized transform coefficient data and run-level coding of run lengths and levels of quantized transform coefficient data. The encoder can determine when to switch between coding modes based on a pre-determined switch point or by counting consecutive coefficients having a predominant value (e.g., zero). A decoder performs corresponding context-adaptive arithmetic decoding.

18 Claims, 23 Drawing Sheets

(56) References Cited

U.S. PATENT DOCUMENTS

| | | |
|---|---|---|
| 4,730,348 A | 3/1988 | MacCrisken |
| 4,792,981 A | 12/1988 | Cahill et al. |
| 4,813,056 A | 3/1989 | Fedele |
| 4,901,075 A | 2/1990 | Vogel |
| 4,968,135 A | 11/1990 | Wallace et al. |
| 5,043,919 A | 8/1991 | Callaway et al. |
| 5,089,818 A | 2/1992 | Mahieux et al. |
| 5,109,451 A | 4/1992 | Aono et al. |
| 5,128,758 A | 7/1992 | Azadegan |
| 5,146,324 A | 9/1992 | Miller et al. |
| 5,179,442 A | 1/1993 | Azadegan |
| 5,227,788 A | 7/1993 | Johnston |
| 5,227,878 A | 7/1993 | Puri et al. |
| 5,253,053 A | 10/1993 | Chu et al. |
| 5,266,941 A | 11/1993 | Akeley et al. |
| 5,270,832 A | 12/1993 | Balkanski et al. |
| 5,367,629 A | 11/1994 | Chu et al. |
| 5,373,513 A | 12/1994 | Howe et al. |
| 5,376,968 A | 12/1994 | Wu et al. |
| 5,381,144 A | 1/1995 | Wilson et al. |
| 5,394,170 A | 2/1995 | Akeley et al. |
| 5,400,075 A | 3/1995 | Savatier |
| 5,408,234 A | 4/1995 | Chu |
| 5,457,495 A | 10/1995 | Hartung |
| 5,461,421 A | 10/1995 | Moon |
| 5,467,134 A | 11/1995 | Laney |
| 5,473,376 A | 12/1995 | Auyeung |
| 5,481,553 A | 1/1996 | Suzuki |
| 5,493,407 A | 2/1996 | Takahara |
| 5,504,591 A | 4/1996 | Dujari |
| 5,508,816 A | 4/1996 | Ueda et al. |
| 5,533,140 A | 7/1996 | Sirat et al. |
| 5,535,305 A | 7/1996 | Acero et al. |
| 5,544,286 A | 8/1996 | Laney |
| 5,559,557 A | 9/1996 | Kato et al. |
| 5,559,831 A | 9/1996 | Keith |
| 5,568,167 A | 10/1996 | Galbi et al. |
| 5,574,449 A | 11/1996 | Golin |
| 5,579,430 A | 11/1996 | Grill et al. |
| 5,592,584 A | 1/1997 | Ferreira et al. |
| 5,627,938 A | 5/1997 | Johnston |
| 5,654,702 A | 8/1997 | Ran |
| 5,654,706 A | 8/1997 | Jeong et al. |
| 5,661,755 A | 8/1997 | Van de Kerkhof |
| 5,664,057 A | 9/1997 | Crossman et al. |
| 5,675,332 A | 10/1997 | Limberg |
| 5,714,950 A | 2/1998 | Jeong et al. |
| 5,717,821 A | 2/1998 | Tsutsui |
| 5,732,156 A | 3/1998 | Watanabe et al. |
| 5,734,340 A | 3/1998 | Kennedy |
| 5,748,789 A | 5/1998 | Lee et al. |
| 5,793,897 A | 8/1998 | Jo et al. |
| 5,801,648 A | 9/1998 | Satoh et al. |
| 5,802,213 A | 9/1998 | Gardos |
| 5,812,971 A | 9/1998 | Herre |
| 5,819,215 A | 10/1998 | Dobson et al. |
| 5,825,830 A | 10/1998 | Kopf |
| 5,825,979 A | 10/1998 | Tsutsui et al. |
| 5,828,426 A | 10/1998 | Yu |
| 5,831,559 A | 11/1998 | Agarwal et al. |
| 5,835,030 A | 11/1998 | Tsutsui et al. |
| 5,835,144 A | 11/1998 | Matsumura |
| 5,844,508 A | 12/1998 | Murashita et al. |
| 5,850,482 A | 12/1998 | Meany et al. |
| 5,883,633 A | 3/1999 | Gill et al. |
| 5,884,269 A | 3/1999 | Cellier et al. |
| 5,889,891 A | 3/1999 | Gersho et al. |
| 5,903,231 A | 5/1999 | Emelko |
| 5,946,043 A | 8/1999 | Lee et al. |
| 5,969,650 A | 10/1999 | Wilson |
| 5,974,184 A | 10/1999 | Eifrig et al. |
| 5,974,380 A | 10/1999 | Smyth et al. |
| 5,982,437 A | 11/1999 | Okazaki |
| 5,983,172 A | 11/1999 | Takashima et al. |
| 5,990,960 A | 11/1999 | Murakami |
| 5,991,451 A | 11/1999 | Keith et al. |
| 5,995,670 A | 11/1999 | Zabinsky |
| 6,002,439 A | 12/1999 | Murakami |
| 6,009,387 A | 12/1999 | Ramaswamy et al. |
| 6,026,195 A | 2/2000 | Eifrig et al. |
| 6,038,536 A | 3/2000 | Haroun et al. |
| 6,041,302 A | 3/2000 | Bruekers |
| 6,049,630 A | 4/2000 | Wang et al. |
| 6,054,943 A | 4/2000 | Lawrence |
| 6,078,691 A | 6/2000 | Luttmer |
| 6,097,759 A | 8/2000 | Murakami et al. |
| 6,097,880 A | 8/2000 | Koyata |
| 6,100,825 A | 8/2000 | Sedluk |
| 6,111,914 A | 8/2000 | Bist |
| 6,140,944 A | 10/2000 | Toyoyama |
| 6,148,109 A | 11/2000 | Boon et al. |
| 6,154,572 A | 11/2000 | Chaddha |
| 6,195,465 B1 | 2/2001 | Zandi et al. |
| 6,205,256 B1 | 3/2001 | Chaddha |
| 6,208,274 B1 | 3/2001 | Taori et al. |
| 6,215,910 B1 | 4/2001 | Chaddha |
| 6,223,162 B1 | 4/2001 | Chen |
| 6,226,407 B1 | 5/2001 | Zabih et al. |
| 6,233,017 B1 | 5/2001 | Chaddha |
| 6,233,359 B1 | 5/2001 | Ratnaker et al. |
| 6,253,165 B1 | 6/2001 | Malvar |
| 6,259,810 B1 | 7/2001 | Gill et al. |
| 6,272,175 B1 | 8/2001 | Sriram et al. |
| 6,292,588 B1 | 9/2001 | Shen |
| 6,300,888 B1 | 10/2001 | Chen |
| 6,304,928 B1 | 10/2001 | Mairs et al. |
| 6,337,881 B1 | 1/2002 | Chaddha |
| 6,341,165 B1 | 1/2002 | Gbur |
| 6,345,123 B1 | 2/2002 | Boon |
| 6,349,152 B1 | 2/2002 | Chaddha |
| 6,360,019 B1 | 3/2002 | Chaddha |
| 6,373,411 B1 | 4/2002 | Shoham |
| 6,373,412 B1 | 4/2002 | Mitchell et al. |
| 6,377,930 B1 | 4/2002 | Chen |
| 6,392,705 B1 | 5/2002 | Chaddha |
| 6,404,931 B1 | 6/2002 | Chen |
| 6,408,029 B1 | 6/2002 | McVeigh et al. |
| 6,420,980 B1 | 7/2002 | Ejima |
| 6,421,738 B1 | 7/2002 | Ratan et al. |
| 6,424,939 B1 | 7/2002 | Herre et al. |
| 6,441,755 B1 | 8/2002 | Dietz et al. |
| 6,477,280 B1 | 11/2002 | Malvar |
| 6,487,535 B1 | 11/2002 | Smyth et al. |
| 6,493,385 B1 | 12/2002 | Sekiguchi et al. |
| 6,542,631 B1 | 4/2003 | Ishikawa |
| 6,542,863 B1 | 4/2003 | Surucu |
| 6,567,781 B1 | 5/2003 | Lafe |
| 6,573,915 B1 | 6/2003 | Sivan et al. |
| 6,577,681 B1 | 6/2003 | Kimura |
| 6,580,834 B2 | 6/2003 | Li et al. |
| 6,587,057 B2 | 7/2003 | Scheuermann |
| 6,606,039 B2 | 8/2003 | Hirano |
| 6,608,935 B2 | 8/2003 | Nagumo et al. |
| 6,636,168 B2 | 10/2003 | Ohashi et al. |
| 6,646,578 B1 | 11/2003 | Au |
| 6,650,784 B2 | 11/2003 | Thyagarajan |
| 6,653,952 B2 | 11/2003 | Hayami et al. |
| 6,678,419 B1 | 1/2004 | Malvar |
| 6,704,360 B2 | 3/2004 | Haskell et al. |
| 6,721,700 B1 | 4/2004 | Yin |
| 6,728,317 B1 | 4/2004 | Demos |
| 6,735,339 B1 | 5/2004 | Ubale |
| 6,766,293 B1 | 7/2004 | Herre et al. |
| 6,771,777 B1 | 8/2004 | Gbur et al. |
| 6,795,584 B2 | 9/2004 | Karczewicz et al. |
| 6,825,847 B1 | 11/2004 | Molnar et al. |
| 6,829,299 B1 | 12/2004 | Chujoh et al. |
| 6,856,701 B2 | 2/2005 | Karczewicz et al. |
| 6,934,677 B2 | 8/2005 | Chen et al. |
| 6,959,116 B2 | 10/2005 | Sezer et al. |
| 7,016,547 B1 | 3/2006 | Smirnov |
| 7,043,088 B2 | 5/2006 | Chiu |
| 7,076,104 B1 | 7/2006 | Keith et al. |
| 7,107,212 B2 | 9/2006 | Van Der Vleuten et al. |

(56) References Cited

U.S. PATENT DOCUMENTS

| | | |
|---|---|---|
| 7,139,703 B2 | 11/2006 | Acero et al. |
| 7,143,030 B2 | 11/2006 | Chen et al. |
| 7,165,028 B2 | 1/2007 | Gong |
| 7,215,707 B2 | 5/2007 | Lee et al. |
| 7,266,149 B2 | 9/2007 | Holcomb |
| 7,274,671 B2 | 9/2007 | Hu |
| 7,328,150 B2 | 2/2008 | Chen et al. |
| 7,433,824 B2* | 10/2008 | Mehrotra et al. ............ 704/501 |
| 7,454,076 B2 | 11/2008 | Chen et al. |
| 7,460,990 B2 | 12/2008 | Mehrotra et al. |
| 7,502,743 B2 | 3/2009 | Thumpudi et al. |
| 7,536,305 B2 | 5/2009 | Chen et al. |
| 7,546,240 B2 | 6/2009 | Mehrotra et al. |
| 7,562,021 B2 | 7/2009 | Mehrotra et al. |
| 7,599,840 B2 | 10/2009 | Mehrotra et al. |
| 7,630,882 B2 | 12/2009 | Mehrotra et al. |
| 7,684,981 B2 | 3/2010 | Thumpudi et al. |
| 7,693,709 B2 | 4/2010 | Thumpudi et al. |
| 7,756,350 B2 | 7/2010 | Vos et al. |
| 7,761,290 B2 | 7/2010 | Koishida et al. |
| 7,822,601 B2 | 10/2010 | Mehrotra et al. |
| 7,840,403 B2* | 11/2010 | Mehrotra et al. ............ 704/222 |
| 8,090,574 B2* | 1/2012 | Mehrotra et al. ............ 704/205 |
| 2002/0009145 A1 | 1/2002 | Natarajan et al. |
| 2002/0031185 A1 | 3/2002 | Webb |
| 2002/0111780 A1 | 8/2002 | Sy |
| 2002/0141422 A1 | 10/2002 | Hu |
| 2003/0006917 A1 | 1/2003 | Ohashi et al. |
| 2003/0033143 A1 | 2/2003 | Aronowitz |
| 2003/0085822 A1 | 5/2003 | Scheuermann |
| 2003/0115055 A1 | 6/2003 | Gong |
| 2003/0138150 A1 | 7/2003 | Srinivasan |
| 2003/0156648 A1 | 8/2003 | Holcomb et al. |
| 2003/0210163 A1 | 11/2003 | Yang |
| 2004/0044521 A1 | 3/2004 | Chen et al. |
| 2004/0044534 A1 | 3/2004 | Chen et al. |
| 2004/0049379 A1 | 3/2004 | Thumpudi et al. |
| 2004/0114810 A1 | 6/2004 | Boliek |
| 2004/0136457 A1 | 7/2004 | Funnell et al. |
| 2004/0184537 A1 | 9/2004 | Geiger et al. |
| 2004/0196903 A1 | 10/2004 | Kottke et al. |
| 2005/0015249 A1 | 1/2005 | Mehrotra et al. |
| 2005/0021317 A1 | 1/2005 | Weng et al. |
| 2005/0052294 A1 | 3/2005 | Liang et al. |
| 2005/0286634 A1 | 12/2005 | Duvivier |
| 2006/0023792 A1 | 2/2006 | Cho et al. |
| 2006/0078208 A1 | 4/2006 | Malvar |
| 2006/0088222 A1 | 4/2006 | Han et al. |
| 2006/0104348 A1 | 5/2006 | Chen et al. |
| 2006/0153304 A1 | 7/2006 | Prakash et al. |
| 2006/0176959 A1 | 8/2006 | Lu et al. |
| 2006/0268990 A1 | 11/2006 | Lin et al. |
| 2006/0285760 A1 | 12/2006 | Malvar |
| 2006/0290539 A1 | 12/2006 | Tomic |
| 2007/0016406 A1* | 1/2007 | Thumpudi et al. ............ 704/205 |
| 2007/0016415 A1* | 1/2007 | Thumpudi et al. ............ 704/230 |
| 2007/0016418 A1* | 1/2007 | Mehrotra et al. ............ 704/240 |
| 2007/0116369 A1 | 5/2007 | Zandi et al. |
| 2007/0126608 A1 | 6/2007 | Sriram |
| 2007/0200737 A1 | 8/2007 | Gao et al. |
| 2007/0242753 A1 | 10/2007 | Jeon et al. |
| 2008/0043030 A1 | 2/2008 | Huang et al. |
| 2008/0089421 A1 | 4/2008 | Je-Chang et al. |
| 2008/0228476 A1* | 9/2008 | Mehrotra et al. ............ 704/230 |
| 2008/0262855 A1* | 10/2008 | Mehrotra et al. ............ 704/500 |
| 2008/0317364 A1 | 12/2008 | Gou et al. |
| 2011/0035225 A1* | 2/2011 | Mehrotra et al. ............ 704/500 |

FOREIGN PATENT DOCUMENTS

| | | |
|---|---|---|
| EP | 0966793 | 9/1998 |
| EP | 0931386 | 1/1999 |
| EP | 1 142 130 | 4/2003 |
| EP | 1 400 954 | 3/2004 |
| EP | 1 142 129 | 6/2004 |
| EP | 1809046 | 5/2009 |
| GB | 2 372 918 | 9/2002 |
| GB | 2 388 502 | 11/2003 |
| JP | 01-091587 | 4/1989 |
| JP | 01-125028 | 5/1989 |
| JP | 03-108824 | 5/1991 |
| JP | 5-199422 | 6/1993 |
| JP | 5-292481 | 11/1993 |
| JP | 06-021830 | 1/1994 |
| JP | 6-217110 | 8/1994 |
| JP | 07-087331 | 3/1995 |
| JP | 07-273658 | 10/1995 |
| JP | 7-274171 | 10/1995 |
| JP | 08-116263 | 5/1996 |
| JP | 08-167852 | 6/1996 |
| JP | 08-190764 | 7/1996 |
| JP | 08-205169 | 8/1996 |
| JP | 08-237138 | 9/1996 |
| JP | 10-229340 | 8/1998 |
| JP | 11-041573 | 2/1999 |
| JP | 2000-338998 | 12/2000 |
| JP | 2001-007707 | 1/2001 |
| JP | 2002-158589 | 5/2002 |
| JP | 2002-198822 | 7/2002 |
| JP | 2002 204170 | 7/2002 |
| JP | 2002-204170 | 7/2002 |
| JP | 2002-540711 | 11/2002 |
| JP | 2007-300389 | 11/2007 |
| WO | WO 88/01811 | 3/1988 |
| WO | WO 91/14340 | 9/1991 |
| WO | WO 98/00924 | 1/1998 |
| WO | WO 98/00977 | 1/1998 |
| WO | WO 02/35849 | 5/2002 |

OTHER PUBLICATIONS

U.S. Appl. No. 60/488,710, filed Jul. 18, 2003, Srinivasan et al.

AAC Standard, ISO/IEC 13818-7, 1993.

Advanced Television Systems Committee, *ATSC Standard: Digital Audio Compression (AC-3), Revision A*, 140 pp. (1995).

Bell et al., "Text Compression," *Prentice Hall*, pp. 105-107, 1990.

Bosi et al., "ISO/IEC MPEG-2 Advance Audio Coding," J. Audio Eng. Soc., vol. 45, No. 10, pp. 789-812 (1997).

Brandenburg, "ASPEC CODING", *AES 10th International Conference*, pp. 81-90 (Sep. 1991).

Brandenburg et al., "ASPEC: Adaptive Spectral Entropy Coding of High Quality Music Signals," Proc. AES, 12 pp. (Feb. 1991).

Brandenburg, "OCF: Coding High Quality Audio with Data Rates of 64 kbit/sec," Proc. AES, 17 pp. (Mar. 1988).

Brandenburg, "High Quality Sound Coding at 2.5 Bits/Sample," Proc. AES, 15 pp. (Mar. 1988).

Brandenburg et al., "Low Bit Rate Codecs for Audio Signals: Implementations in Real Time," Proc. AES, 12 pp. (Nov. 1988).

Brandenburg et al., "Low Bit Rate Coding of High-quality Digital Audio: Algorithms and Evaluation of Quality," Proc. AES, pp. 201-209 (May 1989).

Brandenburg, "OCF—A New Coding Algorithm for High Quality Sound Signals," Proc. ICASSP, pp. 5.1.1-5.1.4 (May 1987).

Brandenburg et al, "Second Generation Perceptual Audio Coding: the Hybrid Coder," AES Preprint, 13 pp. (Mar. 1990).

Chiang et al., "A Radix-2 Non-Restoring 32-b/32-b Ring Divider with Asynchronous Control Scheme," Tamkang Journal of Science and Engineering, vol. 2, No. 1, pp. 37-43 (1999).

Chung et al., "A Novel Memory-efficient Huffman Decoding Algorithm and its Implementation," Signal Processing 62, pp. 207-213 (1997).

Costa et al., "Efficient Run-Length Encoding of Binary Sources with Unknown Statistics", Technical Report No. MSR-TR-2003-95, pp. 1-10, Microsoft Research, Microsoft Corporation (Dec. 2003).

Cui et al., "A novel VLC based on second-run-level coding and dynamic truncation," Proc. SPIE, vol. 6077, pp. 607726-1 to 607726-9 (2006).

Davidson et al., "Still Image Coding Standard—JPEG," Helsinki University of Technology, Chapter 7, 24 pages, downloaded from the World Wide Web (2004).

(56) References Cited

OTHER PUBLICATIONS

Davis, "The AC-3 Multichannel Coder," *Dolby Laboratories Inc.*, Audio Engineering Study, Inc., Oct. 1993.
De Agostino et al., "Parallel Algorithms for Optimal Compression using Dictionaries with the Prefix Property," in *Proc. Data Compression Conference '92, IEEE Computer Society Press*, pp. 52-62 (1992).
Alberto Del Bimbo, "Progettazione e Produzione Multimediale," Univ. degli Studi di Firenze, <http://www.dsi.unifi.it/~delbimbo/documents/ppmm/image_encoding.pdf>, 46 pages (accessed Oct. 19, 2010).
Duhamel et al., "A Fast Algorithm for the Implementation of Filter Banks Based on Time Domain Aliasing Cancellation," *Proc. Int'l Conf. Acous., Speech, and Sig. Process*, pp. 2209-2212 (May 1991).
European Search Report, Application No. 10180949.9, 6 pages, Nov. 22, 2010.
Gailly, "comp.compression Frequently Asked Questions (part 1/3)," 64 pp., document marked Sep. 5, 1999 [Downloaded from the World Wide Web on Sep. 5, 2007].
Gersho et al., "Vector Quantization and Signal Compression," pp. 259-305, 1992.
Gibson et al., "Digital Compression for Multimedia," "Chapter 7: Frequency Domain Coding," *Morgan Kaufmann Publishers*, pp. 227-262, 1998.
Gibson et al., *Digital Compression for Multimedia*, "Chapter 2: Lossless Source Coding," Morgan Kaufmann Publishers, Inc., San Francisco, pp. 17-61 (1998).
Gill et al., "Creating High-Quality Content with Microsoft Windows Media Encoder 7," <http://msdn.microsoft.com/library/en-us/dnwmt/html/contcreation.asp?frame=true> 4 pp. (2000).
Hui et al., "Matsushita Algorithm for Coding of Moving Picture Information," ISO/IEC-JTC1/SC29/WG11, MPEG91/217, 76 pages, Nov. 1991.
Ishii et al., "Parallel Variable Length Decoding with Inverse Quantization for Software MPEG-2 Decoders," IEEE Signal Processing Systems, pp. 500-509 (1997).
"ISO/IEC 11172-3, Information Technology—Coding of Moving Pictures and Associated Audio for Digital Storage Media at Up to About 1.5 Mbit/s—Part 3: Audio," 157 pp. (1993).
"ISO/IEC 13818-7, Information Technology—Generic Coding of Moving Pictures and Associated Audio Information—Part 7: Advanced Audio Coding (AAC)," 152 pp. (1997).
ISO/IEC 14496-2, "Coding of Audio-Visual Object—Part 2: Visual," Third Edition, pp. 1-727, (Jun. 2004).
ITU-T Recommendation H.264, "Series H: Audiovisual and Multimedia Systems, Infrastructure of Audiovisual Services—Coding of Moving Video," International Telecommunication Union, pp. 1-262 (May 2003).
ITU-T Recommendation T.800, "Series T: Terminals for Telematic Services," International Telecommunication Union, pp. 1-194 (Aug. 2002).
Iwadare et al., "A 128 kb/s Hi-Fi Audio CODEC Based on Adaptive Transform Coding with Adaptive Block Size MDCT," *IEEE. J. Sel. Areas in Comm.*, pp. 138-144 (Jan. 1992).
Jeong et al., "Adaptive Huffman Coding of 2-D DCT Coefficients for Image Sequence Compression," *Signal Processing: Image Communication*, vol. 7, 11 pp. (1995).
Johnston, "Perceptual Transform Coding of Wideband Stereo Signals," *Proc. ICASSP*, pp. 1993-1996 (May 1989).
Johnston, "Transform Coding of Audio Signals Using Perceptual Noise Criteria," *IEEE J. Sel. Areas in Comm.*, pp. 314-323 (Feb. 1988).
Mahieux et al., "Transform Coding of Audio Signals at 64 kbits/sec," *Proc. Globecom*, pp. 405.2.1-405.2.5 (Nov. 1990).
Malvar, "Fast Progressive Image Coding without Wavelets", IEEE Data Compression Conference, Snowbird, Utah, 10 pp. (Mar. 2000).
Marpe et al., "Adaptive Codes for H.26L," ITU Study Group 16—Video Coding Experts Group—ISO/IEC MPEG & ITU-T VCEG (ISO/IEC JTC1/SC29/WG11 and ITU-T SG16 Q6), No. VCEG-L13, 7 pages, Jan. 8, 2001.
Murray and Van Ryper, "JPEG compression," Encyclopedia of Graphics File Formats, 2nd Edition, Chapter 9, Section 6, 10 pp., downloaded from the World Wide Web (1996).
Najafzadeh-Azghandi, "Perceptual Coding of Narrowband Audio Signals," Thesis, 139pp. (Apr. 2000).
Nelson, "The Data Compression Book," *M&T Books*, pp. 123-165, 1992.
Princen et al., "Analysis/Synthesis Filter Bank Design Based on Time Domain Aliasing Cancellation," *IEEE Trans. ASSP*, pp. 1153-1161 (Oct. 1986).
Reader, "History of MPEG Video Compression—Ver. 4.0," 99 pp., document marked Dec. 16, 2003.
Schroder et al., "High Quality Digital Audio Encoding with 3.0 Bits/Semple using Adaptive Transform Coding," *Proc. 80th Conv. Aud. Eng. Soc.*, 8 pp. (Mar. 1986).
Shamoon et al., "A Rapidly Adaptive Lossless Compression Algorithm for High Fidelity Audio Coding," *IEEE Data Compression Conf. 1994*, pp. 430-439 (Mar. 1994).
Sullivan et al., "The H.264/AVC Advanced Video Coding Standard: Overview and Introduction to the Fidelity Range Extensions," 21 pp. (Aug. 2004).
Theile et al., "Low-Bit Rate Coding of High Quality Audio Signals," *Proc. AES*, 32 pp. (Mar. 1987).
Tu et al., "Context-Based Entropy Coding of Block Transform Coefficients for Image Compression," *IEEE Transactions on Image Processing*, vol. 11, No. 11, pp. 1271-1283 (Nov. 2002).
Wien, "Variable Block-Size Transforms for Hybrid Video Coding," Dissertation, 182 pp. (Feb. 2004).
Jeon et al., "Huffman Coding of DCT Coefficients Using Dynamic Codeword Assignment and Adaptive Codebook Selection," Signal Processing: Image Communication 12, pp. 253-262 (1998).
Lakhani, "Optimal Humman Coding of DCT Blocks," IEEE Trans. on Circuits and Systems for Video Technology, vol. 14, No. 4, pp. 522-527 (2004).
Herre, Jurgen, "Temporal Noise Shaping, Quantization and Coding Methods in Perceptual Audio Coding: a Tutorial Introduction," AES 17th Int'l Conference on High Quality Audio Coding, 14 pp. (1999).
Memon et al., "Lossless Compression of Video Sequences," IEEE Trans. on Communications, 6 pp. (1996).
Quackenbush et al., "Noiseless Coding of Quantized Spectral Components in MPEG-2 Advanced Audio Coding," Proc. 1997 Workshop on Applications of Signal Processing to Audio and Acoustics, 4 pp. (1997).

\* cited by examiner

Software 180 Implementing Adaptive Audio Data Entropy Coding/Decoding Techniques

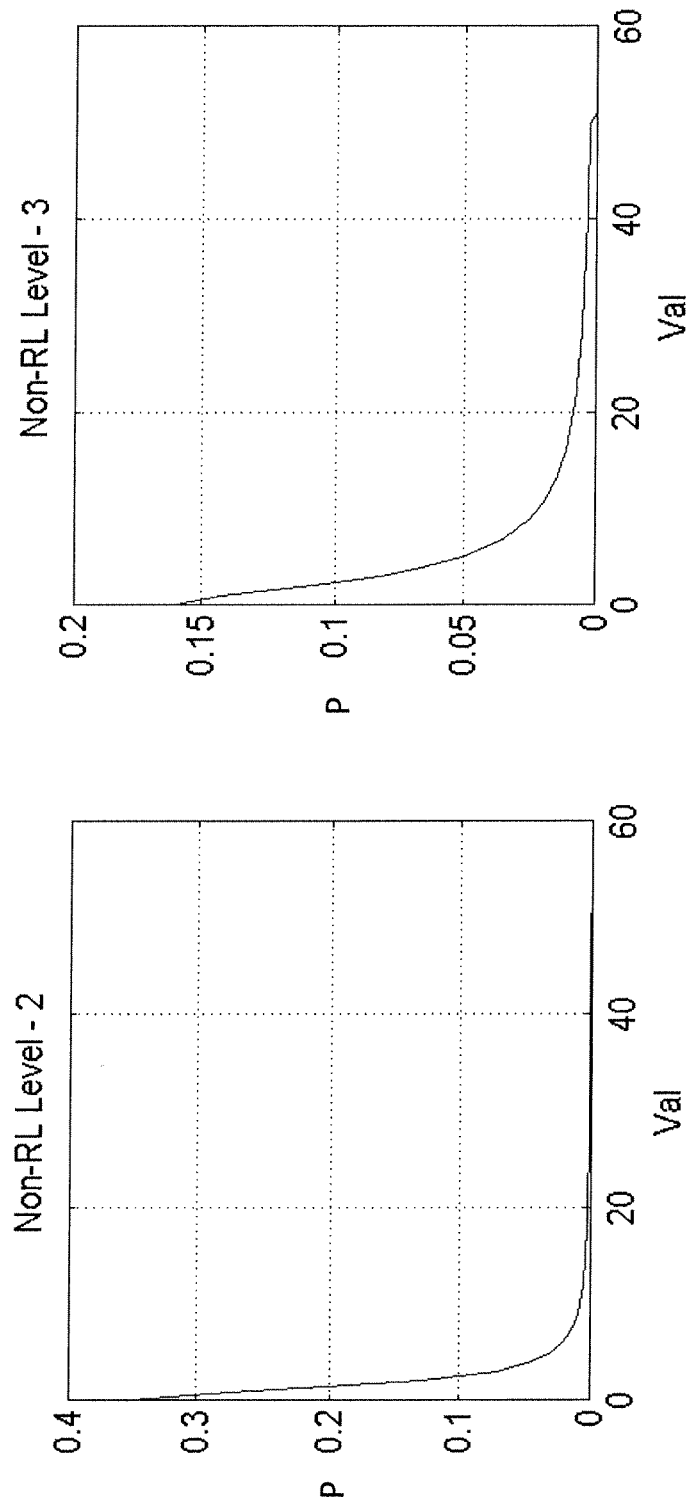

ENTROPY ENCODING AND DECODING USING DIRECT LEVEL AND RUN-LENGTH/LEVEL CONTEXT-ADAPTIVE ARITHMETIC CODING/DECODING MODES

RELATED APPLICATION DATA

This application is a continuation of U.S. patent application Ser. No. 12/907,848, filed Oct. 19, 2010, now U.S. Pat. No. 8,090,574, issued Jan. 3, 2012, which is a continuation of U.S. patent application Ser. No. 12/127,707, filed May 27, 2008, now U.S. Pat. No. 7,840,403, which is a divisional of U.S. patent application Ser. No. 10/647,923, filed Aug. 25, 2003, now U.S. Pat. No. 7,433,824, which claims the benefit of U.S. Provisional Application No. 60/408,538, filed Sep. 4, 2002, the disclosures of which are hereby incorporated herein by reference.

The following concurrently filed U.S. patent applications relate to the present application: 1) U.S. Provisional Patent Application Ser. No. 60/408,517, entitled, "Architecture and Techniques for Audio Encoding and Decoding," filed Sep. 4, 2002, the disclosure of which is hereby incorporated by reference; and 2) U.S. Provisional Patent Application Ser. No. 60/408,432, entitled, "Unified Lossy and Lossless Audio Compression," filed Sep. 4, 2002, the disclosure of which is hereby incorporated by reference.

FIELD

The present invention relates to adaptive entropy encoding of audio data. For example, an audio encoder switches between Huffman coding of direct levels of quantized audio data and arithmetic coding of run lengths and levels of quantized audio data.

BACKGROUND

With the introduction of compact disks, digital wireless telephone networks, and audio delivery over the Internet, digital audio has become commonplace. Engineers use a variety of techniques to process digital audio efficiently while still maintaining the quality of the digital audio. To understand these techniques, it helps to understand how audio information is represented and processed in a computer.

I. Representation of Audio Information in a Computer

A computer processes audio information as a series of numbers representing the audio information. For example, a single number can represent an audio sample, which is an amplitude value (i.e., loudness) at a particular time. Several factors affect the quality of the audio information, including sample depth, sampling rate, and channel mode.

Sample depth (or precision) indicates the range of numbers used to represent a sample. The more values possible for the sample, the higher the quality because the number can capture more subtle variations in amplitude. For example, an 8-bit sample has 256 possible values, while a 16-bit sample has 65,536 possible values.

The sampling rate (usually measured as the number of samples per second) also affects quality. The higher the sampling rate, the higher the quality because more frequencies of sound can be represented. Some common sampling rates are 8,000, 11,025, 22,050, 32,000, 44,100, 48,000, and 96,000 samples/second.

Table 1 shows several formats of audio with different quality levels, along with corresponding raw bitrate costs.

TABLE 1

Bitrates for different quality audio information

| Quality | Sample Depth (bits/sample) | Sampling Rate (samples/second) | Mode | Raw Bitrate (bits/second) |
|---|---|---|---|---|
| Internet telephony | 8 | 8,000 | mono | 64,000 |
| Telephone | 8 | 11,025 | mono | 88,200 |
| CD audio | 16 | 44,100 | stereo | 1,411,200 |
| High quality audio | 16 | 48,000 | stereo | 1,536,000 |

As Table 1 shows, the cost of high quality audio information such as CD audio is high bitrate. High quality audio information consumes large amounts of computer storage and transmission capacity. Companies and consumers increasingly depend on computers, however, to create, distribute, and play back high quality audio content.

II. Audio Compression and Decompression

Many computers and computer networks lack the resources to process raw digital audio. Compression (also called encoding or coding) decreases the cost of storing and transmitting audio information by converting the information into a lower bitrate form. Compression can be lossless (in which quality does not suffer) or lossy (in which quality suffers but bitrate reduction through lossless compression is more dramatic). Decompression (also called decoding) extracts a reconstructed version of the original information from the compressed form.

Generally, the goal of audio compression is to digitally represent audio signals to provide maximum signal quality with the least possible amount of bits. A conventional audio encoder/decoder ["codec"] system uses subband/transform coding, quantization, rate control, and variable length coding to achieve its compression. The quantization and other lossy compression techniques introduce potentially audible noise into an audio signal. The audibility of the noise depends on how much noise there is and how much of the noise the listener perceives. The first factor relates mainly to objective quality, while the second factor depends on human perception of sound. The conventional audio encoder then losslessly compresses the quantized data using variable length coding to further reduce bitrate.

A. Lossy Compression and Decompression of Audio Data

Conventionally, an audio encoder uses a variety of different lossy compression techniques. These lossy compression techniques typically involve frequency transforms, perceptual modeling/weighting, and quantization. The corresponding decompression involves inverse quantization, inverse weighting, and inverse frequency transforms.

Frequency transform techniques convert data into a form that makes it easier to separate perceptually important information from perceptually unimportant information. The less important information can then be subjected to more lossy compression, while the more important information is preserved, so as to provide the best perceived quality for a given bitrate. A frequency transformer typically receives the audio samples and converts them into data in the frequency domain, sometimes called frequency coefficients or spectral coefficients.

Most energy in natural sounds such as speech and music is concentrated in the low frequency range. This means that, statistically, higher frequency ranges will have more frequency coefficients that are zero or near zero, reflecting the lack of energy in the higher frequency ranges.

Perceptual modeling involves processing audio data according to a model of the human auditory system to improve the perceived quality of the reconstructed audio signal for a given bitrate. For example, an auditory model typically considers the range of human hearing and critical bands. Using the results of the perceptual modeling, an encoder shapes noise (e.g., quantization noise) in the audio data with the goal of minimizing the audibility of the noise for a given bitrate. While the encoder must at times introduce noise (e.g., quantization noise) to reduce bitrate, the weighting allows the encoder to put more noise in bands where it is less audible, and vice versa.

Quantization maps ranges of input values to single values, introducing irreversible loss of information or quantization noise, but also allowing an encoder to regulate the quality and bitrate of the output. Sometimes, the encoder performs quantization in conjunction with a rate controller that adjusts the quantization to regulate bitrate and/or quality. There are various kinds of quantization, including adaptive and non-adaptive, scalar and vector, uniform and non-uniform. Perceptual weighting can be considered a form of non-uniform quantization.

Inverse quantization and inverse weighting reconstruct the weighted, quantized frequency coefficient data to an approximation of the original frequency coefficient data. The inverse frequency transformer then converts the reconstructed frequency coefficient data into reconstructed time domain audio samples.

B. Lossless Compression and Decompression of Audio Data

Conventionally, an audio encoder uses one or more of a variety of different lossless compression techniques. In general, lossless compression techniques include run-length encoding, Huffman encoding, and arithmetic coding. The corresponding decompression techniques include run-length decoding, Huffman decoding, and arithmetic decoding.

Run-length encoding is a simple, well-known compression technique used for camera video, text, and other types of content. In general, run-length encoding replaces a sequence (i.e., run) of consecutive symbols having the same value with the value and the length of the sequence. In run-length decoding, the sequence of consecutive symbols is reconstructed from the run value and run length. Numerous variations of run-length encoding/decoding have been developed. For additional information about run-length encoding/decoding and some of its variations, see, e.g., Bell et al., *Text Compression*, Prentice Hall PTR, pages 105-107, 1990; Gibson et al., *Digital Compression for Multimedia*, Morgan Kaufmann, pages 17-62, 1998; U.S. Pat. No. 6,304,928 to Mairs et al.; U.S. Pat. No. 5,883,633 to Gill et al; and U.S. Pat. No. 6,233,017 to Chaddha.

Run-level encoding is similar to run-length encoding in that runs of consecutive symbols having the same value are replaced with run lengths. The value for the runs is the predominant value (e.g., 0) in the data, and runs are separated by one or more levels having a different value (e.g., a non-zero value).

The results of run-length encoding (e.g., the run values and run lengths) or run-level encoding can be Huffman encoded to further reduce bitrate. If so, the Huffman encoded data is Huffman decoded before run-length decoding.

Huffman encoding is another well-known compression technique used for camera video, text, and other types of content. In general, a Huffman code table associates variable-length Huffman codes with unique symbol values (or unique combinations of values). Shorter codes are assigned to more probable symbol values, and longer codes are assigned to less probable symbol values. The probabilities are computed for typical examples of some kind of content. Or, the probabilities are computed for data just encoded or data to be encoded, in which case the Huffman codes adapt to changing probabilities for the unique symbol values. Compared to static Huffman coding, adaptive Huffman coding usually reduces the bitrate of compressed data by incorporating more accurate probabilities for the data, but extra information specifying the Huffman codes may also need to be transmitted.

To encode symbols, the Huffman encoder replaces symbol values with the variable-length Huffman codes associated with the symbol values in the Huffman code table. To decode, the Huffman decoder replaces the Huffman codes with the symbol values associated with the Huffman codes.

In scalar Huffman coding, a Huffman code table associates a single Huffman code with one value, for example, a direct level of a quantized data value. In vector Huffman coding, a Huffman code table associates a single Huffman code with a combination of values, for example, a group of direct levels of quantized data values in a particular order. Vector Huffman encoding can lead to better bitrate reduction than scalar Huffman encoding (e.g., by allowing the encoder to exploit probabilities fractionally in binary Huffman codes). On the other hand, the codebook for vector Huffman encoding can be extremely large when single codes represent large groups of symbols or symbols have large ranges of potential values (due to the large number of potential combinations). For example, if the alphabet size is 256 (for values 0 to 255 per symbol) and the number of symbols per vector is 4, the number of potential combinations is $256^4$=4,294,967,296. This consumes memory and processing resources in computing the codebook and finding Huffman codes, and consumes transmission resources in transmitting the codebook.

Numerous variations of Huffman encoding/decoding have been developed. For additional information about Huffman encoding/decoding and some of its variations, see, e.g., Bell et al., *Text Compression*, Prentice Hall PTR, pages 105-107, 1990; Gibson et al., *Digital Compression for Multimedia*, Morgan Kaufmann, pages 17-62, 1998.

U.S. Pat. No. 6,223,162 to Chen et al. describes multi-level run-length coding of audio data. A frequency transformation produces a series of frequency coefficient values. For portions of a frequency spectrum in which the predominant value is zero, a multi-level run-length encoder statistically correlates runs of zero values with adjacent non-zero values and assigns variable length code words. An encoder uses a specialized codebook generated with respect to the probability of receiving an input run of zero-valued spectral coefficients followed by a non-zero coefficient. A corresponding decoder associates a variable length code word with a run of zero value coefficients and adjacent non-zero value coefficient.

U.S. Pat. No. 6,377,930 to Chen et al. describes variable to variable length encoding of audio data. An encoder assigns a variable length code to a variable size group of frequency coefficient values.

U.S. Pat. No. 6,300,888 to Chen et al. describes entropy code mode switching for frequency domain audio coding. A frequency-domain audio encoder selects among different entropy coding modes according to the characteristics of an input stream. In particular, the input stream is partitioned into frequency ranges according to statistical criteria derived from statistical analysis of typical or actual input to be encoded. Each range is assigned an entropy encoder optimized to encode that range's type of data. During encoding and decoding, a mode selector applies the correct method to the different frequency ranges. Partition boundaries can be decided in advance, allowing the decoder to implicitly know which decoding method to apply to encoded data. Or, adaptive arrangements may be used, in which boundaries are flagged in the output stream to indicate a change in encoding mode for subsequent data. For example, a partition boundary separates primarily zero quantized frequency coefficients from primarily non-zero quantized coefficients, and then applies coders optimized for such data.

For additional detail about the Chen patents, see the patents themselves.

Arithmetic coding is another well-known compression technique used for camera video and other types of content. Arithmetic coding is sometimes used in applications where the optimal number of bits to encode a given input symbol is a fractional number of bits, and in cases where a statistical correlation among certain individual input symbols exists. Arithmetic coding generally involves representing an input sequence as a single number within a given range. Typically, the number is a fractional number between 0 and 1. Symbols in the input sequence are associated with ranges occupying portions of the space between 0 and 1. The ranges are calculated based on the probability of the particular symbol occurring in the input sequence. The fractional number used to represent the input sequence is constructed with reference to the ranges. Therefore, probability distributions for input symbols are important in arithmetic coding schemes.

In context-based arithmetic coding, different probability distributions for the input symbols are associated with different contexts. The probability distribution used to encode the input sequence changes when the context changes. The context can be calculated by measuring different factors that are expected to affect the probability of a particular input symbol appearing in an input sequence. For additional information about arithmetic encoding/decoding and some of its variations, see Nelson, *The Data Compression Book*, "Huffman One Better: Arithmetic Coding," Chapter 5, pp. 123-65 (1992).

Various codec systems and standards use lossless compression and decompression, including versions of Microsoft Corporation's Windows Media Audio ["WMA"] encoder and decoder. Other codec systems are provided or specified by the Motion Picture Experts Group, Audio Layer 3 ["MP3"] standard, the Motion Picture Experts Group 2, Advanced Audio Coding ["AAC"] standard, and Dolby AC3. For additional information, see the respective standards or technical publications.

Whatever the advantages of prior techniques and systems for lossless compression of audio data, they do not have the advantages of the present invention.

SUMMARY

In summary, the detailed description is directed to various techniques and tools for adaptive entropy encoding and decoding of audio data. The various techniques and tools can be used in combination or independently.

In one aspect, an encoder encodes a first portion of an audio data sequence in a direct variable-dimension vector Huffman encoding mode, switches to a run-level encoding mode at a switch point, and encodes a second portion in the run-level encoding mode (e.g., context-based arithmetic encoding, Huffman coding, vector Huffman coding). For example, the first portion consists primarily of non-zero quantized audio coefficients, and the second portion consists primarily of zero-value quantized audio coefficients. The switch point can be pre-determined (e.g., by testing efficiency of encoding the sequence using the switch point) or adaptively determined. The encoder can send a flag indicating the switch point in an encoded bitstream.

In another aspect, a decoder decodes a first portion of an encoded sequence in a direct variable-dimension vector Huffman decoding mode, switches to a run-level decoding mode at a switch point, and decodes a second portion in the run-level decoding mode (e.g., context-based arithmetic decoding, Huffman decoding, vector Huffman decoding). Prior to switching, the decoder can receive a flag indicating the switch point.

In another aspect, an encoder or decoder encodes or decodes a first portion of a sequence in a direct context-based arithmetic mode, switches to a run-level mode at a switch-point, and encodes or decodes a second portion in the run-level mode. The run-level mode can be context-based arithmetic mode.

In another aspect, an encoder selects a first code table from a set of plural code tables based on the number of symbols in a first vector and represents the first vector with a code from the first code table. The first code table can include codes for representing probable vectors having that number of symbols, and an escape code for less probable vectors. The encoder also encodes a second vector having a different number of symbols. For example, the first vector has a greater number of symbols than the second vector and has a higher probability of occurrence than the second vector. To encode the second vector, the encoder can select a second, different code table based on the number of symbols in the second vector. If the second vector has one symbol, the encoder can represent the second vector using a table-less encoding technique.

In another aspect, a decoder decodes a first vector by receiving a first code and looking up the first code in a first code table. If the first code is an escape code, the decoder receives and decodes a second code that is not in the first table. If the first code is not an escape code, the decoder looks up symbols for the first vector in the first table and includes them in a decoded data stream. The number of symbols in the first vector is the basis for whether the first code is an escape code. The decoder can decode the second code by looking it up in a second table. If the second code is an escape code, the decoder receives and decodes a third code representing the first vector that is not in the second table. If the second code is not an escape code, the decoder looks up symbols for the first vector in the second table and includes the symbols in the decoded data stream.

In another aspect, an encoder encodes audio data coefficients using a table-less encoding technique. If a coefficient is within a first value range, the encoder encodes the coefficient with a one-bit code followed by an 8-bit encoded value. For other value ranges, the encoder encodes the coefficient with a two-bit code followed by a 16-bit encoded value, a three-bit code followed by a 24-bit encoded value, or a different three-bit code followed by a 31-bit encoded value.

In another aspect, in a vector Huffman encoding scheme, an encoder determines a Huffman code from a group of such codes to use for encoding a vector and encodes the vector using the Huffman code. The determination of the code is based on a sum of values of the audio data symbols in the vector. If the Huffman code is an escape code, it indicates that an n-dimension vector is to be encoded as x n/x-dimension vectors using at least one different code table. The encoder can compare the sum with a threshold that depends on the number of symbols in the vector. For example, the threshold is 6 for 4 symbols, 16 for 2 symbols, or 100 for 1 symbol.

In another aspect, an encoder receives a sequence of audio data and encodes at least part of the sequence using context-based arithmetic encoding. A decoder receives an encoded sequence of audio data coefficients and decodes at least part of the encoded sequence using context-based arithmetic decoding.

In another aspect, an encoder encodes audio data coefficients using context-based arithmetic coding. One or more contexts have associated probability distributions representing probabilities of coefficients. The encoder adaptively determines a context for a current coefficient based at least in part on a mode of representation of the current coefficient and encodes the current coefficient using the context. For example, if the mode of representation is direct, the encoder adaptively determines the context based at least in part on the direct levels of previous coefficients (e.g., the two coefficients immediately preceding the current coefficient). If the mode of representation is run-level, the encoder adaptively determines the context based at least in part on the percentage of zero-value coefficients the previous run length of zero-value coefficients in the audio input sequence. If the mode of representation is run-level, and the encoder adaptively determines the context based at least in part on the current run length of zero-value coefficients, the previous run length of zero-value coefficients, and the direct levels of previous coefficients.

In another aspect, an encoder or decoder encodes or decodes a first portion of audio data using direct encoding or decoding, maintaining a count of consecutive coefficients equal to a predominant value (e.g., 0). If the count exceeds a threshold, the encoder or decoder encodes or decodes a second portion of the audio data using run-level encoding or decoding. The threshold can be static or determined adaptively. The threshold can depend on the size of the block of coefficients. For example, the threshold can be 4 for a block of 256 coefficients, or 8 for a block of 512 coefficients.

In another aspect, an encoder or decoder encodes or decodes a first portion of a sequence using a first code table and a second portion of the sequence using a second code table. The first table is used when longer runs of consecutive coefficients equal to a predominant value (e.g., 0) are more likely, and the second table is used when shorter runs of consecutive coefficients of equal value are more likely. The table that is used can be indicated by a signal bit.

The features and advantages of the adaptive entropy encoding and decoding techniques will be made apparent from the following detailed description of various embodiments that proceeds with reference to the accompanying drawings.

BRIEF DESCRIPTION OF THE DRAWINGS

FIGS. 13A-13D are probability distributions for non run-length levels in a context-based arithmetic encoding scheme.

DETAILED DESCRIPTION

In described embodiments, an audio encoder performs several adaptive entropy encoding techniques. The adaptive entropy encoding techniques improve the performance of the encoder, reducing bitrate and/or improving quality. A decoder performs corresponding entropy decoding techniques. While the techniques are described in places herein as part of a single, integrated system, the techniques can be applied separately, potentially in combination with other techniques.

The audio encoder and decoder process discrete audio signals. In the described embodiments, the audio signals are quantized coefficients from frequency transformed audio signals. Alternatively, the encoder and decoder process another kind of discrete audio signal or discrete signal representing video or another kind of information.

In some embodiments, an audio encoder adaptively switches between coding of direct signal levels and coding of run lengths and signal levels. The encoder encodes the direct signal levels using scalar Huffman codes, vector Huffman codes, arithmetic coding, or another technique. In the run length/level coding (also called run-level coding), each run length represents a run of zero or more zeroes and each signal level represents a non-zero value. In the run-level event space, the encoder encodes run lengths and levels in that event space using Huffman codes, arithmetic coding, or another technique. A decoder performs corresponding adaptive switching during decoding. The adaptive switching occurs when a threshold number of zero value levels is reached. Alternatively, the encoder and decoder switch based upon additional or other criteria.

In some embodiments, an audio encoder uses variable-dimension vector Huffman encoding. The variable-dimension vector Huffman coding allows the encoder to use Huffman codes to represent more probable combinations of symbols using larger dimension vectors, and less probable combinations of symbols using smaller dimension vectors or scalars. A decoder performs corresponding variable-dimension Huffman decoding.

In some embodiments, an audio encoder uses context-based arithmetic coding. The contexts used by the encoder allow efficient compression of different kinds of audio data. A decoder performs corresponding context-based arithmetic decoding.

In described embodiments, the audio encoder and decoder perform various techniques. Although the operations for these techniques are typically described in a particular, sequential order for the sake of presentation, it should be understood that this manner of description encompasses minor rearrangements in the order of operations. Moreover, for the sake of simplicity, flowcharts typically do not show the various ways in which particular techniques can be used in conjunction with other techniques.

I. Computing Environment

Figure 1:
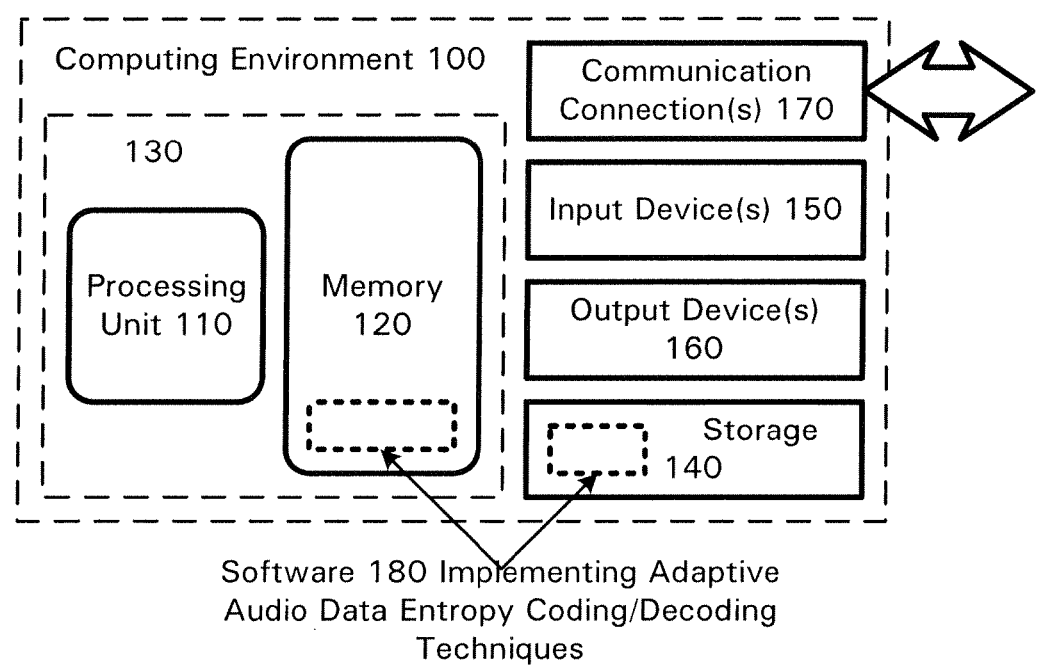
FIG. 1 is a block diagram of a suitable computing environment in which described embodiments may be implemented.

FIG. 1 illustrates a generalized example of a suitable computing environment (100) in which described embodiments may be implemented. The computing environment (100) is not intended to suggest any limitation as to scope of use or functionality of the invention, as the present invention may be implemented in diverse general-purpose or special-purpose computing environments.

With reference to FIG. 1, the computing environment (100) includes at least one processing unit (110) and memory (120). In FIG. 1, this most basic configuration (130) is included within a dashed line. The processing unit (110) executes computer-executable instructions and may be a real or a virtual processor. In a multi-processing system, multiple processing units execute computer-executable instructions to increase processing power. The memory (120) may be volatile memory (e.g., registers, cache, RAM), non-volatile memory (e.g., ROM, EEPROM, flash memory, etc.), or some combination of the two. The memory (120) stores software (180) implementing an audio encoder/decoder that performs adaptive entropy coding/decoding of audio data.

A computing environment may have additional features. For example, the computing environment (100) includes storage (140), one or more input devices (150), one or more output devices (160), and one or more communication connections (170). An interconnection mechanism (not shown) such as a bus, controller, or network interconnects the components of the computing environment (100). Typically, operating system software (not shown) provides an operating environment for other software executing in the computing environment (100), and coordinates activities of the components of the computing environment (100).

The storage (140) may be removable or non-removable, and includes magnetic disks, magnetic tapes or cassettes, CD-ROMs, CD-RWs, DVDs, or any other medium which can be used to store information and which can be accessed within the computing environment (100). The storage (140) stores instructions for the software (180) implementing the audio encoder/decoder that performs adaptive entropy coding/decoding of audio data.

The input device(s) (150) may be a touch input device such as a keyboard, mouse, pen, or trackball, a voice input device, a scanning device, network adapter, or another device that provides input to the computing environment (100). For audio, the input device(s) (150) may be a sound card or similar device that accepts audio input in analog or digital form, or a CD-ROM reader that provides audio samples to the computing environment. The output device(s) (160) may be a display, printer, speaker, CD/DVD-writer, network adapter, or another device that provides output from the computing environment (100).

The communication connection(s) (170) enable communication over a communication medium to another computing entity. The communication medium conveys information such as computer-executable instructions, compressed audio information, or other data in a modulated data signal. A modulated data signal is a signal that has one or more of its characteristics set or changed to encode information in the signal. By way of example, and not limitation, communication media include wired or wireless techniques implemented with an electrical, optical, RF, infrared, acoustic, or other carrier.

The invention can be described in the general context of computer-readable media. Computer-readable media are any available media that can be accessed within a computing environment. By way of example, and not limitation, within the computing environment (100), computer-readable media include memory (120), storage (140), communication media, and combinations of any of the above.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "analyze," "send," "compare," and "check" to describe computer operations in a computing environment. These terms are high-level abstractions for operations performed by a computer, and should not be confused with acts performed by a human being. The actual computer operations corresponding to these terms vary depending on implementation.

II. Generalized Audio Encoder and Decoder

Figure 2:
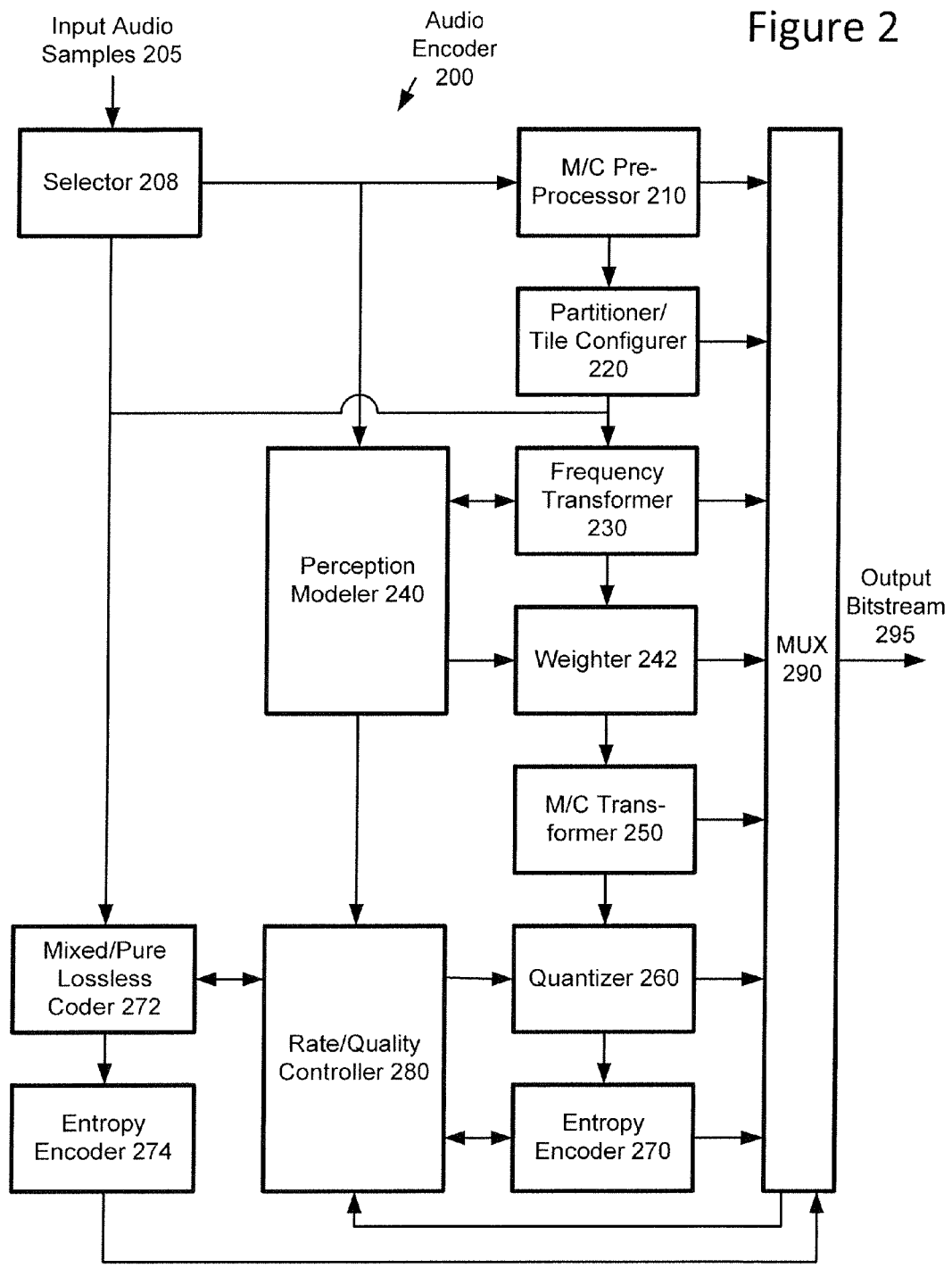
FIG. 2 is a block diagram of an audio encoder in which described embodiments may be implemented.
Figure 3:
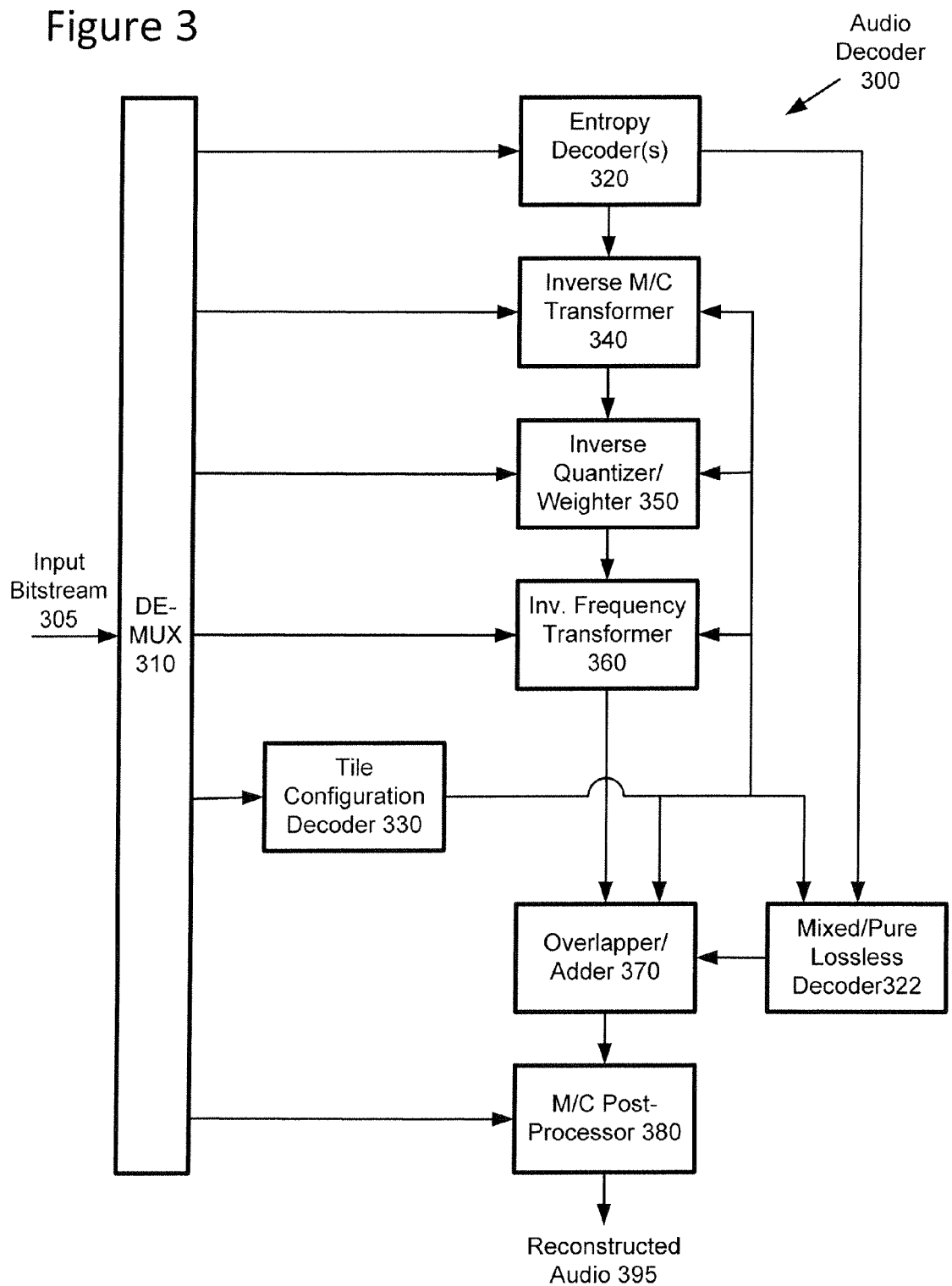
FIG. 3 is a block diagram of an audio decoder in which described embodiments may be implemented.

FIG. 2 is a block diagram of a generalized audio encoder (200) in which described embodiments may be implemented. The encoder (200) performs adaptive entropy coding of audio data. FIG. 3 is a block diagram of a generalized audio decoder (300) in which described embodiments may be implemented. The decoder (300) decodes encoded audio data.

The relationships shown between modules within the encoder and decoder indicate a flow of information in an exemplary encoder and decoder; other relationships are not shown for the sake of simplicity. Depending on implementation and the type of compression desired, modules of the encoder or decoder can be added, omitted, split into multiple modules, combined with other modules, and/or replaced with like modules. In alternative embodiments, encoders or decoders with different modules and/or other configurations perform adaptive entropy coding and decoding of audio data.

A. Generalized Audio Encoder

The generalized audio encoder (200) includes a selector (208), a multi-channel pre-processor (210), a partitioner/tile configurer (220), a frequency transformer (230), a perception modeler (240), a weighter (242), a multi-channel transformer (250), a quantizer (260), an entropy encoder (270), a controller (280), a mixed/pure lossless coder (272) and associated entropy encoder (274), and a bitstream multiplexer ["MUX"] (290). Description about some of the modules of the encoder (200) follows. For description about the other modules of the encoder (200) in some embodiments, see the applications referenced in the Related Application Data section.

The encoder (200) receives a time series of input audio samples (205) at some sampling depth and rate in pulse code modulated ["PCM"] format. The input audio samples (205) can be multi-channel audio (e.g., stereo mode, surround) or mono. The encoder (200) compresses the audio samples (205) and multiplexes information produced by the various modules of the encoder (200) to output a bitstream (295) in a format such as a Windows Media Audio ["WMA"] format or Advanced Streaming Format ["ASF"]. Alternatively, the encoder (200) works with other input and/or output formats.

Initially, the selector (208) selects between multiple encoding modes for the audio samples (205). In FIG. 2, the selector (208) switches between two modes: a mixed/pure lossless coding mode and a lossy coding mode. The lossless coding mode includes the mixed/pure lossless coder (272) and is typically used for high quality (and high bitrate) compression. The lossy coding mode includes components such as the weighter (242) and quantizer (260) and is typically used for adjustable quality (and controlled bitrate) compression. The selection decision at the selector (208) depends upon user input (e.g., a user selecting lossless encoding for making high quality audio copies) or other criteria. In other circumstances (e.g., when lossy compression fails to deliver adequate quality or overproduces bits), the encoder (200) may switch from lossy coding over to mixed/pure lossless coding for a frame or set of frames.

The frequency transformer (230) receives the audio samples (205) and converts them into data in the frequency domain. The frequency transformer (230) outputs blocks of frequency coefficient data to the weighter (242) and outputs side information such as block sizes to the MUX (290). The frequency transformer (230) outputs both the frequency coefficients and the side information to the perception modeler (240).

The perception modeler (240) models properties of the human auditory system to improve the perceived quality of the reconstructed audio signal for a given bitrate. Generally, the perception modeler (240) processes the audio data according to an auditory model, then provides information to the weighter (242) which can be used to generate weighting factors for the audio data. The perception modeler (240) uses any of various auditory models and passes excitation pattern information or other information to the weighter (242).

As a quantization band weighter, the weighter (242) generates weighting factors for a quantization matrix based upon the information received from the perception modeler (240) and applies the weighting factors to the data received from the frequency transformer (230). The weighter (242) outputs side information such as the set of weighting factors to the MUX (290). As a channel weighter, the weighter (242) then generates channel-specific weighting factors based on the information received from the perception modeler (240) and also on the quality of locally reconstructed signal. These scalar weights allow the reconstructed channels to have approximately uniform quality. The weighter (242) outputs weighted blocks of coefficient data to the multi-channel transformer (250) and outputs side information such as the set of channel weight factors to the MUX (290). Alternatively, the encoder (200) uses another form of weighting or skips weighting.

For multi-channel audio data, the multiple channels of noise-shaped frequency coefficient data produced by the weighter (242) often correlate. To exploit this correlation, the multi-channel transformer (250) can apply a multi-channel transform to the audio data. The multi-channel transformer (250) produces side information to the MUX (290) indicating, for example, the multi-channel transforms used and multi-channel transformed parts of frames.

The quantizer (260) quantizes the output of the multi-channel transformer (250), producing quantized coefficient data to the entropy encoder (270) and side information including quantization step sizes to the MUX (290). Quantization introduces irreversible loss of information, but also allows the encoder (200) to regulate the quality and bitrate of the output bitstream (295) in conjunction with the controller (280). In some embodiments, the quantizer (260) is an adaptive, uniform, scalar quantizer. In alternative embodiments, the quantizer is a non-uniform quantizer, a vector quantizer, and/or a non-adaptive quantizer, or uses a different form of adaptive, uniform, scalar quantization.

The entropy encoder (270) losslessly compresses quantized coefficient data received from the quantizer (260). In some embodiments, the entropy encoder (270) uses adaptive entropy encoding as described in the sections below. The entropy encoder (270) can compute the number of bits spent encoding audio information and pass this information to the rate/quality controller (280).

The controller (280) works with the quantizer (260) to regulate the bitrate and/or quality of the output of the encoder (200). The controller (280) receives information from other modules of the encoder (200) and processes the received information to determine desired quantization factors given current conditions. The controller (280) outputs the quantization factors to the quantizer (260) with the goal of satisfying quality and/or bitrate constraints.

The mixed lossless/pure lossless encoder (272) and associated entropy encoder (274) compress audio data for the mixed/pure lossless coding mode. The encoder (200) uses the mixed/pure lossless coding mode for an entire sequence or switches between coding modes on a frame-by-frame or other basis.

The MUX (290) multiplexes the side information received from the other modules of the audio encoder (200) along with the entropy encoded data received from the entropy encoder (270). The MUX (290) outputs the information in a WMA format or another format that an audio decoder recognizes. The MUX (290) includes a virtual buffer that stores the bitstream (295) to be output by the encoder (200). The current fullness of the buffer, the rate of change of fullness of the buffer, and other characteristics of the buffer can be used by the controller (280) to regulate quality and/or bitrate for different applications (e.g., at constant quality/variable bitrate, at or below constant bitrate/variable quality).

B. Generalized Audio Decoder

With reference to FIG. 3, the generalized audio decoder (300) includes a bitstream demultiplexer ["DEMUX"] (310), one or more entropy decoders (320), a mixed/pure lossless decoder (322), a tile configuration decoder (330), an inverse multi-channel transformer (340), an inverse quantizer/weighter (350), an inverse frequency transformer (360), an overlapper/adder (370), and a multi-channel post-processor (380). The decoder (300) is somewhat simpler than the encoder (300) because the decoder (300) does not include modules for rate/quality control or perception modeling. Description about some of the modules of the decoder (300) follows. For description about the other modules of the decoder (300) in some embodiments, see the applications referenced in the Related Application Data section.

The decoder (300) receives a bitstream (305) of compressed audio information in a WMA format or another format. The bitstream (305) includes entropy encoded data as well as side information from which the decoder (300) reconstructs audio samples (395).

The DEMUX (310) parses information in the bitstream (305) and sends information to the modules of the decoder (300). The DEMUX (310) includes one or more buffers to compensate for short-term variations in bitrate due to fluctuations in complexity of the audio, network jitter, and/or other factors.

The one or more entropy decoders (320) losslessly decompress entropy codes received from the DEMUX (310). For the sake of simplicity, one entropy decoder module is shown in FIG. 3, although different entropy decoders may be used for lossy and lossless coding modes, or even within modes. Also, for the sake of simplicity, FIG. 3 does not show mode selection logic. The entropy decoder (320) typically applies the inverse of the entropy encoding technique used in the encoder (200). When decoding data compressed in lossy coding mode, the entropy decoder (320) produces quantized frequency coefficient data.

The mixed/pure lossless decoder (322) and associated entropy decoder(s) (320) decompress losslessly encoded audio data for the mixed/pure lossless coding mode. The decoder (300) uses a particular decoding mode for an entire sequence, or switches decoding modes on a frame-by-frame or other basis.

The inverse multi-channel transformer (340) receives the entropy decoded quantized frequency coefficient data from the entropy decoder(s) (320) as well as side information from the DEMUX (310) indicating, for example, the multi-channel transform used and transformed parts of frames.

The inverse quantizer/weighter (350) receives quantization factors as well as quantization matrices from the DEMUX (310) and receives quantized frequency coefficient data from the inverse multi-channel transformer (340). The inverse quantizer/weighter (350) decompresses the received quantization factor/matrix information as necessary, then performs the inverse quantization and weighting.

The inverse frequency transformer (360) receives the frequency coefficient data output by the inverse quantizer/weighter (350) as well as side information from the DEMUX (310). The inverse frequency transformer (360) applies the inverse of the frequency transform used in the encoder and outputs blocks to the overlapper/adder (370).

The overlapper/adder (370) receives decoded information from the inverse frequency transformer (360) and/or mixed/pure lossless decoder (322). The overlapper/adder (370) overlaps and adds audio data as necessary and interleaves frames or other sequences of audio data encoded with different modes.

III. Adaptive Entropy Encoding/Decoding Mode Switching

Run-level coding methods are often more effective than direct coding of levels when an input sequence contains many occurrences of a single value (e.g., 0). However, because non-zero quantized transform coefficients are common in audio data input sequences, especially in the lower frequencies, run-level coding is not effective across the entire range of frequencies. Moreover, in higher quality audio, non-zero quantized transform coefficients become more common even in higher frequencies. (In higher quality audio, quantization levels are typically smaller.) Therefore, in some embodiments, an encoder such as the encoder (200) of FIG. 2 performs a multi-mode coding technique that can use run-level coding for one portion of an audio data input sequence and direct coding of levels for another portion of the sequence. A decoder such as the decoder (300) of FIG. 3 performs a corresponding multi-mode decoding technique.

A. Adaptive Entropy Encoding Mode Switching

Figure 4:
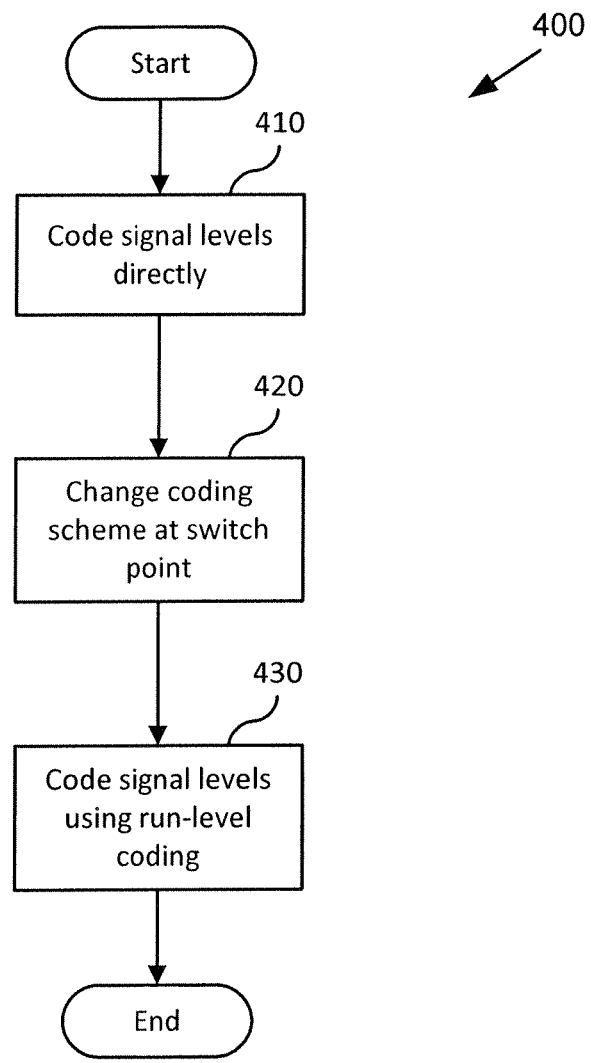
FIG. 4 is flowchart showing a generalized multi-mode audio encoding technique.

Referring to FIG. 4, in a multi-mode encoding technique 400, the encoder first codes signal levels in an input stream directly (410). For example, the encoder performs variable-dimension Huffman coding, context-based arithmetic coding, or another entropy coding technique directly on the signal levels.

At a switch point during the encoding, the encoder changes the coding scheme (420). The encoder may change the encoding scheme at a pre-determined switch point, or the encoder may analyze the input data to determine an appropriate point to change coding schemes. For example, the encoder may analyze an input sequence to find the best point to switch to run-level coding, sending the switch point to the decoder in the output bitstream. Or, the encoder may calculate the switch point adaptively by counting consecutive zeroes (or alternatively, another predominant value) in the input data, and switch to run-level coding when a particular threshold number of consecutive zeroes has been counted. The decoder can calculate the switch point in the same way, so the switch point need not be included in the bitstream. Or, the encoder and decoder use some other criteria to determine the switch point.

After the switch point, the encoder codes remaining signal levels using run-level coding (430). For example, the encoder performs Huffman coding, context-based arithmetic coding, or another entropy coding technique on the run lengths and signal levels. The encoder may use the same technique (e.g., context-based arithmetic coding) before and after the switch point, or the encoder may use different techniques.

Moreover, although FIG. 4 and various other Figures in the application show a single switch point, additional switch points can be used to divide input data into more than two portions. For example, additional adaptive switch points can be set for increased thresholds of consecutive zeroes. Different encoding schemes can then be applied to the different portions. Or, the encoder can experiment with different segmentation points in the sequence, weighing the coding efficiencies for different segmentation configurations along with the costs of signaling the different configurations to the decoder.

Figure 5:
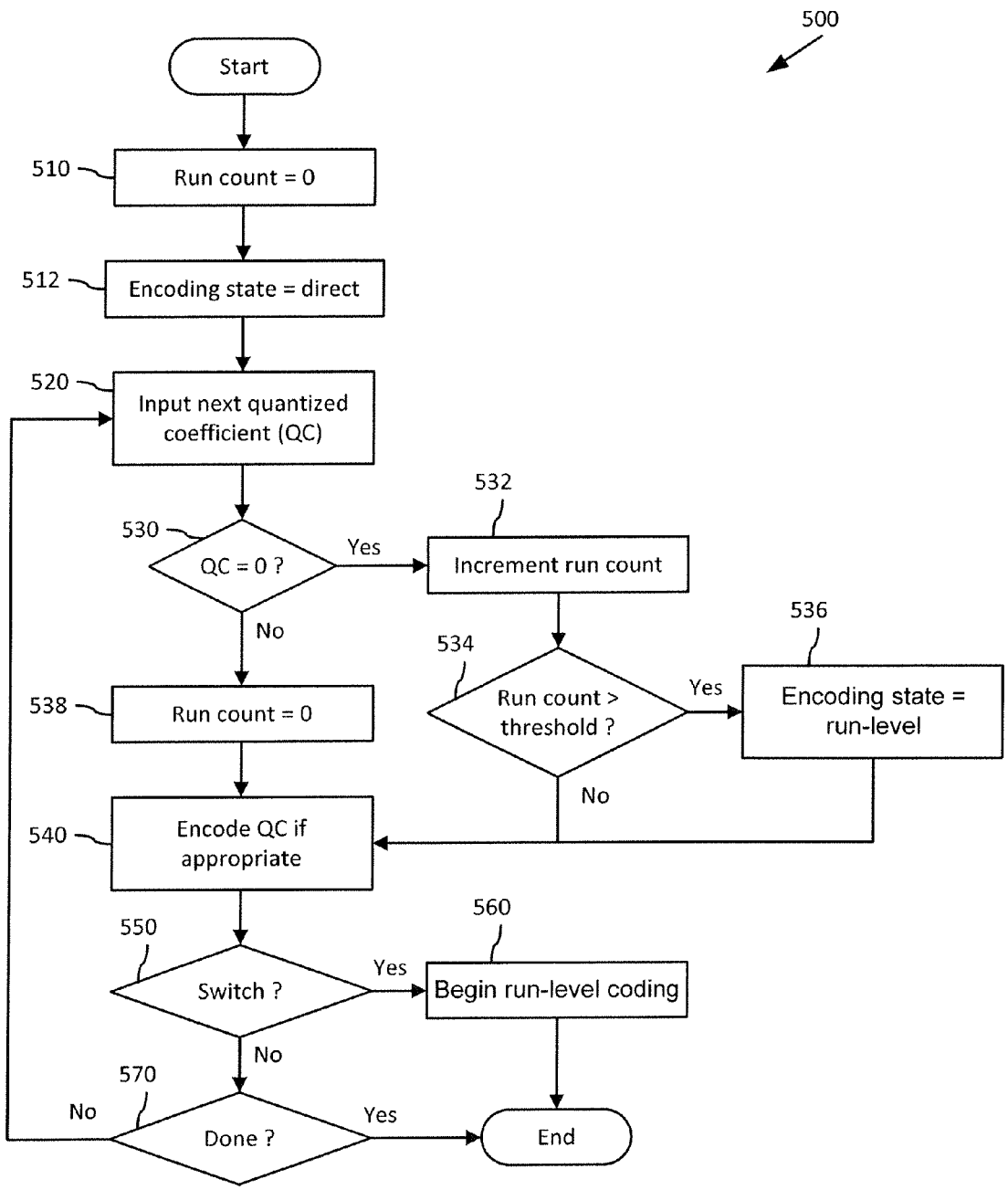
FIG. 5 is a flowchart showing a multi-mode audio encoding technique with adaptive switch point calculation.

FIG. 5 shows a multi-mode encoding technique (500) with adaptive switch point calculation according to one implementation. The adaptive switch point depends on a count of consecutive zero-value coefficients. The input data are signal levels for quantized transform coefficients, progressing from the lowest-frequency coefficient to the highest-frequency coefficient. In practice, the position of the switch point depends on the signal being compressed and the bitrate/quality of the encoding. Alternatively, the input data are another form and/or organization of audio data.

To start, the encoder initializes several variables. Specifically, the encoder sets a run count variable to 0 (510) and sets an encoding state variable to "direct" (512).

The encoder receives the next coefficient QC as input (520). The encoder then checks (530) if the coefficient QC is zero. If the coefficient QC is non-zero, the encoder resets the run count (538). Otherwise (i.e., if the coefficient QC is zero), the encoder increments the run count variable (532), and checks to see whether the current run count exceeds the run count threshold (534). The run count threshold can be static or it can depend on a factor such as the size of a block of coefficients (e.g., a run count threshold of 4 for a sequence of 256 coefficients, 8 for a sequence of 512 coefficients, etc.), or it can be adaptive in some other way. If the run count exceeds the threshold, the encoder changes the encoding state to run-level encoding ["RLE"] (536).

The encoder then encodes the coefficient QC if appropriate (540). (In some cases, groups of coefficients are coded together using a technique such as vector Huffman coding. In such cases, the encoder may defer encoding the coefficient QC.)

The encoder then checks (550) whether the encoder should switch encoding modes. In particular, the encoder checks the encoding state. If the encoding state is no longer direct (e.g., if the encoder has changed the encoding state to RLE as a result of reaching a threshold number of zero coefficients), the encoder begins run-level encoding of the coefficients (560). (Again, in cases in which groups of coefficients are coded together, the encoder may defer the switching decision until reaching a convenient break point for a group of coefficients.)

If the encoder does not switch encoding modes, the encoder checks whether it has finished encoding the coefficients (570). If so, the encoder exits. Otherwise, the encoder inputs the next coefficient (520) to continue the encoding process.

B. Adaptive Entropy Decoding Mode Switching

Figure 6:
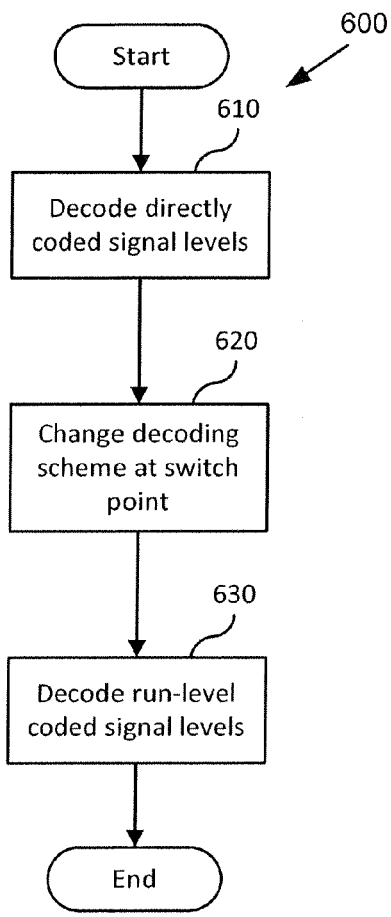
FIG. 6 is a flowchart showing a generalized multi-mode audio decoding technique.

Referring to FIG. 6, in a multi-mode decoding technique (600), the decoder decodes directly coded signal levels (610). For example, the decoder performs variable-dimension Huffman decoding, context-based arithmetic decoding, or another entropy decoding technique on directly coded signal levels.

At a switch point during the decoding, the decoder changes the decoding scheme (620). If the switch point is pre-determined, the decoder may receive, in the form of a flag or other notification mechanism, data that explicitly tells the decoder when to change decoding schemes. Or, the decoder may adaptively calculate when to change decoding schemes based on the input data it receives. If the decoder calculates the switch point, the decoder uses the same calculating technique used by the encoder to ensure that the decoding scheme changes at the correct point. For example, the decoder counts consecutive zeroes (or alternatively, another predominant value) to determine the switch point adaptively. In one implementation, the decoder uses a technique corresponding to the encoder technique shown in FIG. 5. Or, the decoder uses some other criteria to determine the switch point.

After the switch point, the decoder decodes remaining run-level coded signal levels (630). For example, the decoder performs Huffman decoding, context-based arithmetic decoding, or another entropy decoding technique on the encoded run lengths and signal levels. The decoder may use the same technique (e.g., context-based arithmetic decoding) before and after the switch point, or the decoder may use different techniques.

IV. Variable Dimension Huffman Encoding and Decoding

While symbols such as direct signal levels can be encoded using scalar Huffman encoding, such an approach is limited where the optimal number of bits for encoding a symbol is a fractional number. Scalar Huffman coding is also limited by the inability of scalar Huffman codes to account for statistical correlation between symbols. Vector Huffman encoding yields better bitrate reduction than scalar Huffman encoding (e.g., by allowing the encoder to exploit probabilities fractionally in binary Huffman codes). And, in general, higher-dimension vectors yield better bitrate reduction than smaller-dimension vectors. However, if a code is assigned to each possible symbol combination, codebook size increases exponentially as the vector dimension increases. For example, in a 32-bit system, the number of possible combinations for a 4-dimension vector is $(2^{32})^4$. The search time for matching a vector and finding a Huffman code also increases dramatically as codebook size increases.

In some embodiments, to reduce codebook size, an encoder such as the encoder (200) of FIG. 2 uses a variable-dimension vector Huffman coding technique. Rather than assigning a codebook code to each possible n-dimensional combination, a limited number of the most probable n-dimension vectors are assigned codes. If a particular n-dimension vector is not assigned a code, the n-dimension vector is instead encoded as smaller dimension vectors (e.g., two n/2-dimension vectors), as scalars with Huffman codes, or as scalars using some table-less technique for representing discrete values. A decoder such as the decoder (300) of FIG. 3 reconstructs a vector by finding the code(s) for the vector and finding the associated values.

For example, in the case of 4-dimensional vectors with 256 values possible per symbol, the encoder encodes the 500 most probable 4-dimensional vectors with Huffman codes and uses an escape code to indicate other vectors. The encoder splits such other vectors into 2-dimensional vectors. The encoder encodes the 500 most probable 2-dimensional vectors with Huffman codes and uses an escape code to indicate other vectors, which are split and coded with scalar Huffman codes. Thus, the encoder uses 501+501+256 codes.

In terms of determining which vectors or scalars are represented with Huffman codes in a table, and in terms of assigning the Huffman codes themselves for a table, codebook construction can be static, adaptive to data previously encoded, or adaptive to the data to be encoded.

A. Variable-Dimension Vector Huffman Encoding

Figure 7:
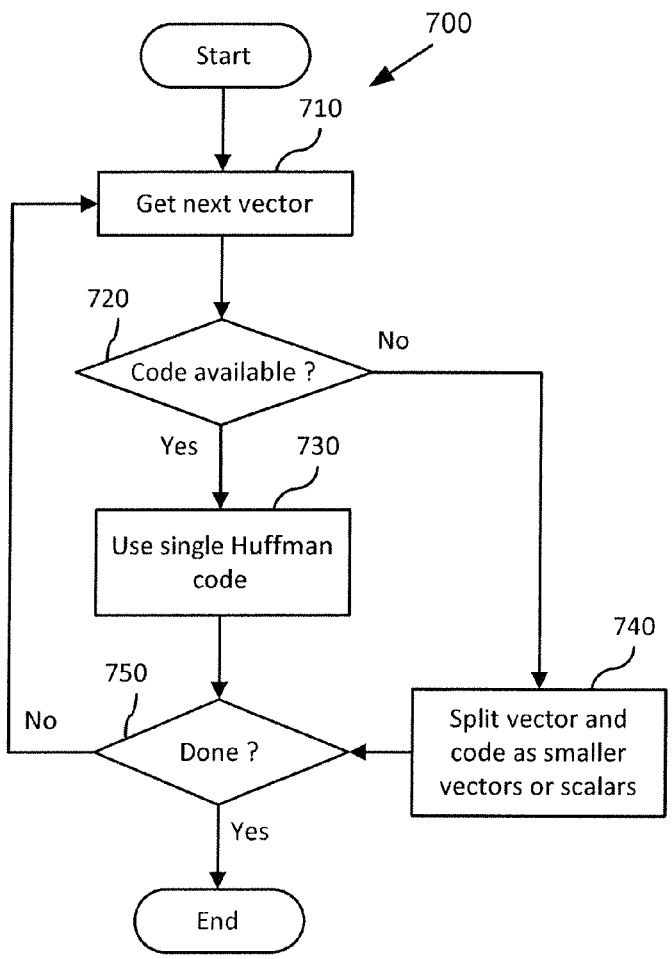
FIG. 7 is a flowchart showing a generalized variable-dimension vector Huffman encoding technique.

Referring to FIG. 7, an encoder uses a variable-dimension vector Huffman ["VDVH"] encoding technique (700). For example, the encoder uses the technique (700) to directly encode signal levels for frequency coefficients of audio data. Alternatively, the encoder uses the technique (700) to encode another form of audio data. For the sake of simplicity, FIG. 7 does not show codebook construction. Codebook construction can be static, adaptive to data previously encoded, or adaptive to the data to be encoded.

The encoder gets (710) the next vector of n symbols. For example, the encoder gets the next 4 symbols in sequence.

The encoder checks (720) whether the codebook includes a code for the vector. If so, the encoder uses (730) a single Huffman code to encode the vector. For example, to determine how to encode an n-dimension vector, the encoder checks an n-dimension vector code table for a code associated with the vector. Because larger-dimension vectors usually yield greater bitrate savings, the encoder uses Huffman codes for the most probable, n-dimension vectors. But, to limit the size of the table, only some of the n-dimension vectors have associated codes.

If the codebook does not include a code for the vector, the encoder splits (740) the vector into smaller vectors and/or scalars and codes the smaller vectors and/or scalars. For example, the encoder splits a vector of n symbols into x n/x-symbol vectors. For each n/x symbol vector, the encoder recursively repeats the encoding technique, exiting when the n/x symbol vector or its constituent vectors/scalars are encoded with Huffman codes or (for scalars) using a table-less technique for representing discrete values.

The encoder then checks (750) whether there are any additional vectors to encode. If not, the encoder exits. Otherwise, the encoder gets (710) the next vector of n symbols.

1. Example Implementation

Figure 8:
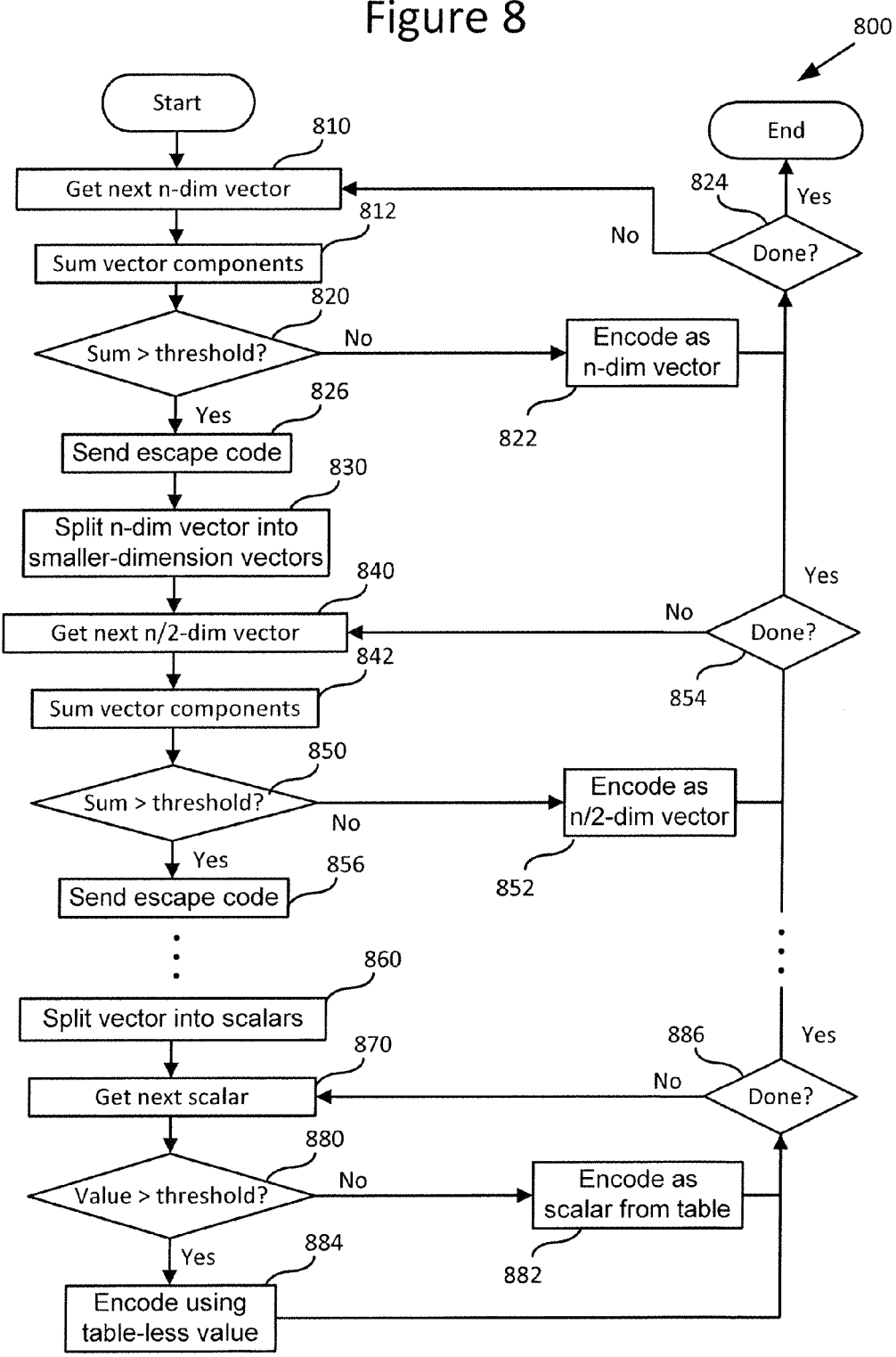
FIG. 8 is a flowchart showing a detailed technique for encoding audio data using variable-dimension vector Huffman encoding.

FIG. 8 shows a detailed technique (800) for encoding vectors using VDVH encoding in one implementation. In the technique (800), the encoder sums the integer values of the symbols in a vector of symbols to determine whether to encode the vector using a single Huffman code or split the vector into smaller vectors/scalars. This effectively limits codebook size and speeds up the search for codes.

A codebook table for n-dimension ["n-dim"] vectors includes Huffman codes for $L_1$ n-dim vectors. The codebook table also includes an escape code. The $L_1$ codes are for each vector for which the sum of the vector components (which are integers) is below a particular threshold $T_1$. For example, suppose n is 4 and the threshold $T_1$ for 4-dim vectors is 6. The codebook table for 4-dim vectors includes the escape code and 126 codes, one for each possible vector whose components (e.g., the absolute values of components) add up to less than 6—(0, 0, 0, 0), (0, 0, 0, 1), etc. Limiting the table size based upon the component sum of vectors is effective because, generally, the most probable vectors are those with smaller component sums.

If the codebook table for n-dim vectors does not have a Huffman code for a particular n-dim vector, the encoder adds an escape code to the output bitstream and encodes the n-dim vector as smaller dimension vectors or scalars, looking up those smaller dimension vectors or scalars in other codebook tables. For example, the smaller dimension is n/2 unless n/2 is 1, in which case the n-dim vector is split into scalars. Alternatively, the n-dim vector is split in some other way.

The codebook table for the smaller dimension vectors includes Huffman codes for $L_2$ smaller dimension vectors as well as an escape code. The $L_2$ codes are for each vector for which the sum of the vector components is below a particular threshold $T_2$ for the smaller dimension table. For example, suppose the smaller dimension is 2 and the threshold $T_2$ for 2-dim vectors is 16. The codebook table for 2-dim vectors includes the escape code and 136 codes, one for each possible vector whose components (e.g., the absolute values of components) add up to less than 16—(0, 0), (0, 1), etc.

If the codebook table for smaller dimension vectors does not have a Huffman code for a particular smaller dimension vector, the encoder adds an escape code to the output bitstream and encodes the vector as even smaller dimension vectors or scalars, using other codebook tables. This process repeats down to the scalar level. For example, the split is by a power of 2 down to the scalar level. Alternatively, the vector is split in some other way.

At the scalar level, the codebook table includes Huffman codes for $L_3$ scalars as well as an escape code. The $L_3$ codes are for each scalar below a particular threshold $T_3$ (which assumes small values are more probable). For example, suppose the threshold $T_3$ for scalars is 100. The codebook table for scalars includes 100 codes and an escape code. If a scalar does not have an associated code in the scalar code table, the scalar is coded with the escape code and a value (e.g., literal) according to a table-less technique. Using all of the numerical examples given in this section, the tables would include a total of 126+1+136+1+100+1=365 codes.

The dimension sizes for tables, vector splitting factors, and thresholds for vector component sums depend on implementation. Other implementations use different vector sizes, different splitting factors, and/or different thresholds. Alternatively, an encoder uses criteria other than vector component sums to switch vector sizes/codebook tables in VDVH encoding.

With reference to FIG. 8, the encoder first gets an n-dim vector (810). The n-dim vector comprises n symbols, each symbol, for example, having a value representing the quantized level for a frequency coefficient of audio data.

The encoder sums the vector components (812) and compares the sum with a threshold (820) for n-dim vectors. If the sum is less than or equal to the threshold, the encoder codes the n-dim vector with a Huffman code from a code table (822), and continues until coding is complete (824). If the sum is greater than or equal to the threshold, the encoder sends an escape code (826) and splits the n-dim vector into two smaller vectors with dimensions of n/2 (830).

The encoder gets the next n/2-dim vector (840) and sums the components of the n/2-dim vector (842). The encoder checks the sum against a threshold associated with n/2-dim vectors (850). If the sum is less than or equal to the threshold, the encoder codes the n/2-dim vector with a Huffman code from a code table (852) for n/2-dim vectors, and gets the next n/2-dim vector (840) if the encoder has not finished encoding the n/2-dim vectors (854). If the sum is greater than the threshold for n/2-dim vectors, the encoder sends another escape code (856).

The encoder generally follows this pattern in processing the vectors, either coding each vector or splitting the vector into smaller-dimension vectors. In cases where the encoder splits a vector into two scalar (1-dimension) components (860), the encoder gets the next scalar (870) and compares the value of the scalar with a threshold associated with scalar values (880). If the scalar value is less than or equal to the threshold (880), the encoder codes the scalar using a Huffman code from a code table (882) for scalars. If the scalar value is greater than the threshold, the encoder codes the scalar using a table-less technique (884). The encoder then gets the next scalar (870) if it has not finished processing the scalars (886).

Alternatively, the encoder uses tables with different dimension sizes, splits vectors in some way other than by power of 2, and/or uses a criteria other than vector component sum to switch vector sizes/codebook tables in VDVH encoding.

2. Adaptive Switching

Figure 9:
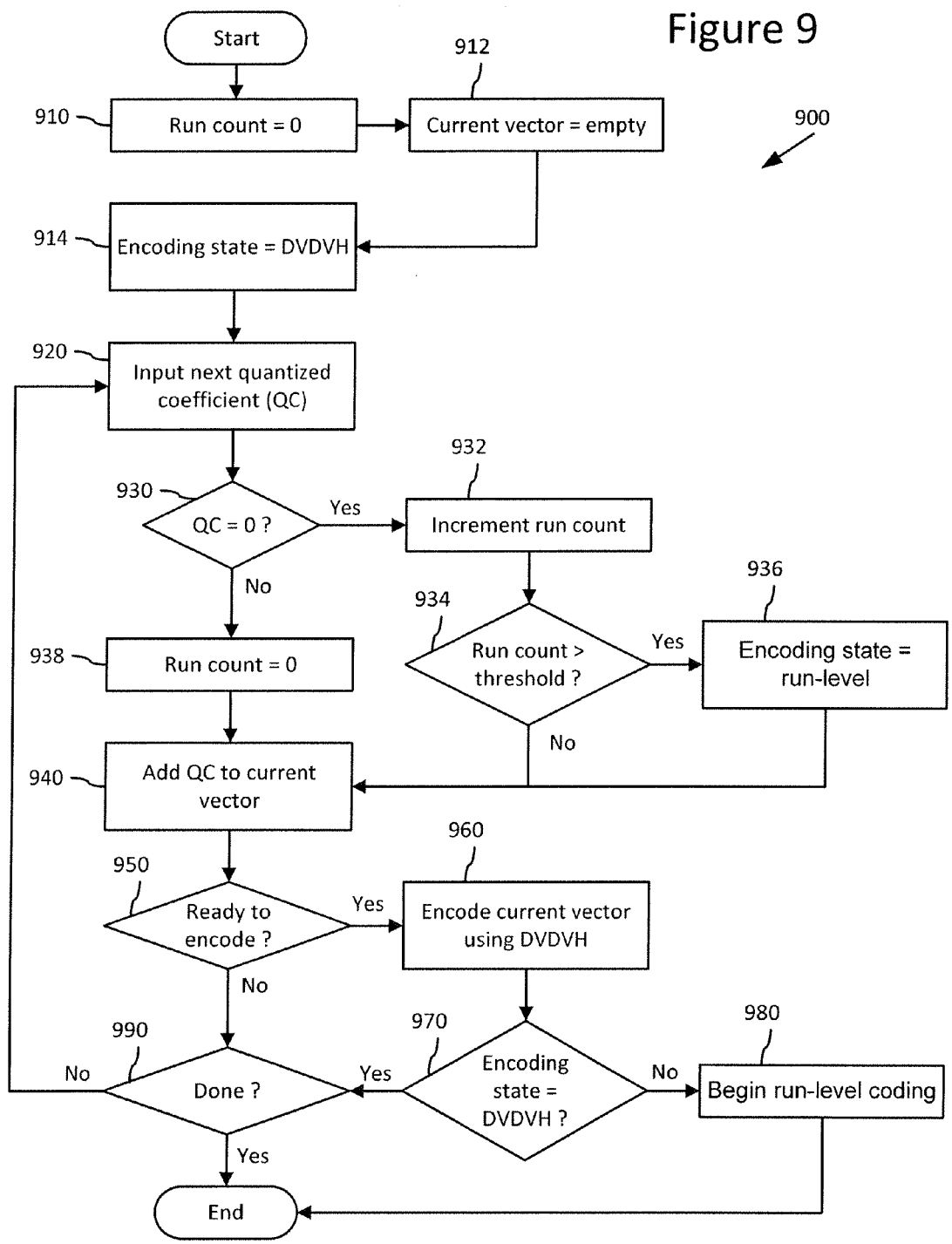
FIG. 9 is a flowchart showing a technique for variable-dimension vector Huffman coding of direct signal levels where the encoder adaptively determines a switch point for changing to coding of run lengths and signal levels.

FIG. 9 shows a technique (900) for VDVH coding of coefficients of direct signal levels where the encoder adaptively determines a switch point for changing to coding of run lengths and signal levels according to one implementation. The adaptive switch point depends on a count of consecutive zero-value coefficients. The input data are signal levels for quantized transform coefficients, progressing from the lowest-frequency coefficient to the highest-frequency coefficient. Alternatively, the input data are another form and/or organization of audio data.

To start, the encoder initializes several variables. Specifically, the encoder sets a run count variable to 0 (910), sets a current vector variable to empty (912), and sets an encoding state variable to direct variable-dimension vector Huffman ["DVDVH"] (914).

The encoder receives the next coefficient QC as input (920). The encoder then checks (930) if the coefficient is zero. If the coefficient QC is non-zero, the encoder resets the run count (938) and adds the coefficient QC to the current vector (940). Otherwise (i.e., if the coefficient QC is zero), the encoder increments the run count variable (932), and checks to see whether the current run count exceeds the run count threshold (934). The run count threshold can be static or it can depend on a factor such as the size of a block of coefficients (e.g., four zeroes in an input sequence of 256 coefficients), or it can be adaptive in some other way. For example, the threshold may be increased or decreased, with or without regard to the number of coefficients in an input sequence. If the run count exceeds the threshold, the encoder changes the encoding state to run-level encoding ["RLE"] (936), and the coefficient QC is added as a component to the current vector (940).

Adding the coefficient QC to the current vector increments the dimension of the vector. The encoder determines (950) whether the current vector is ready to encode by comparing the number of components in the current vector with the maximum dimension for the current vector. If so, the encoder encodes the current vector using DVDVH coding (960). If the current vector is smaller than the maximum dimension, but the coefficient QC is the last in a sequence, the encoder can pad the current vector and encode it using DVDVH coding (960). The maximum dimension depends on implementation.

In one implementation, it is 8. However, the maximum dimension may be increased or decreased depending on, for example, the amount of resources available for creating, storing or transmitting a codebook.

After encoding the vector, the encoder checks the encoding state (970). If the encoding state is no longer DVDVH (e.g., if the encoder has changed the encoding state to RLE as a result of exceeding a threshold number of zero coefficients), the encoder begins encoding of the coefficients as run lengths and levels (980). Run-level encoding can be performed in several ways, including, for example, Huffman coding, vector Huffman coding, or context-based arithmetic coding. In some embodiments, run-level encoding is performed using Huffman coding with two Huffman code tables, where one table is used for encoding data in which shorter runs are more likely, and one table is used for encoding data in which longer runs are more likely. The encoder tries each table, and chooses codes from one of the tables, with a signal bit indicating which table the encoder used.

If the encoding state has not changed or the current vector is not ready for encoding, the encoder determines (990) whether there are any more coefficients to be encoded. If so, the encoder inputs the next coefficient (920) and continues the encoding process.

B. Variable-Dimension Vector Huffman Decoding

Figure 10:
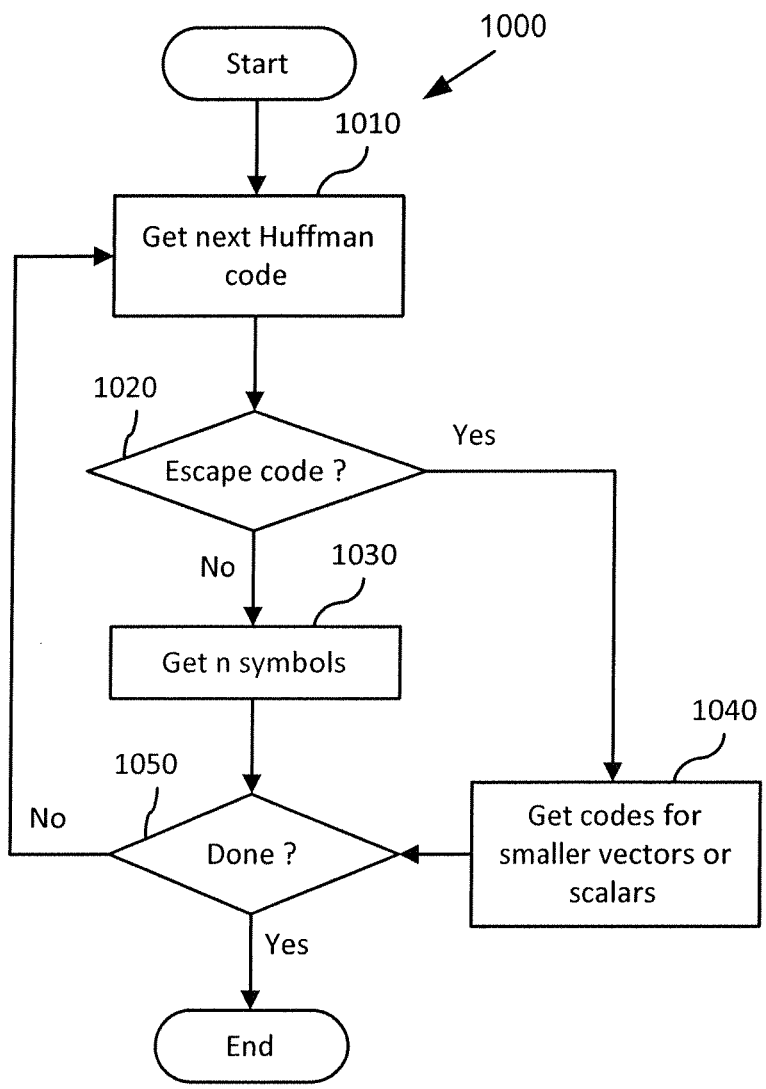
FIG. 10 is a flowchart showing a generalized variable-dimension vector Huffman decoding technique.

FIG. 10 shows a VDVH decoding technique (1000) corresponding to the VDVH encoding technique (700) shown in FIG. 7. For example, a decoder uses the technique (1000) to decode directly encoded signal levels for frequency coefficients of audio data. Alternatively, the decoder uses the technique to decode another form of audio data.

The decoder gets (1010) the next Huffman code for an n-dimension vector Huffman coding table. For example, the decoder gets the next Huffman code for 4 symbols in sequence.

The decoder checks (1020) whether the Huffman code is the escape code for the n-dimension vector Huffman coding table. If not, the decoder gets (1030) the n symbols represented by the Huffman code. For example, the decoder gets the 4 symbols associated with the Huffman code in a 4-dimensional vector Huffman codebook.

If code is the escape code, the n-dimension codebook does not include a code for the vector, and the decoder gets (1040) Huffman codes for smaller vectors and/or scalars. For example, the decoder gets codes for x n/x-symbol vectors. For each n/x symbol vector, the decoder recursively repeats the decoding technique, exiting when the n/x symbol vector or its constituent vectors/scalars are decoded.

The decoder then checks (1050) whether there are any additional codes for the n-dimension vector Huffman coding table to decode. If not, the decoder exits. Otherwise, the decoder gets (1010) the next such Huffman code.

1. Example Implementation

Figure 11:
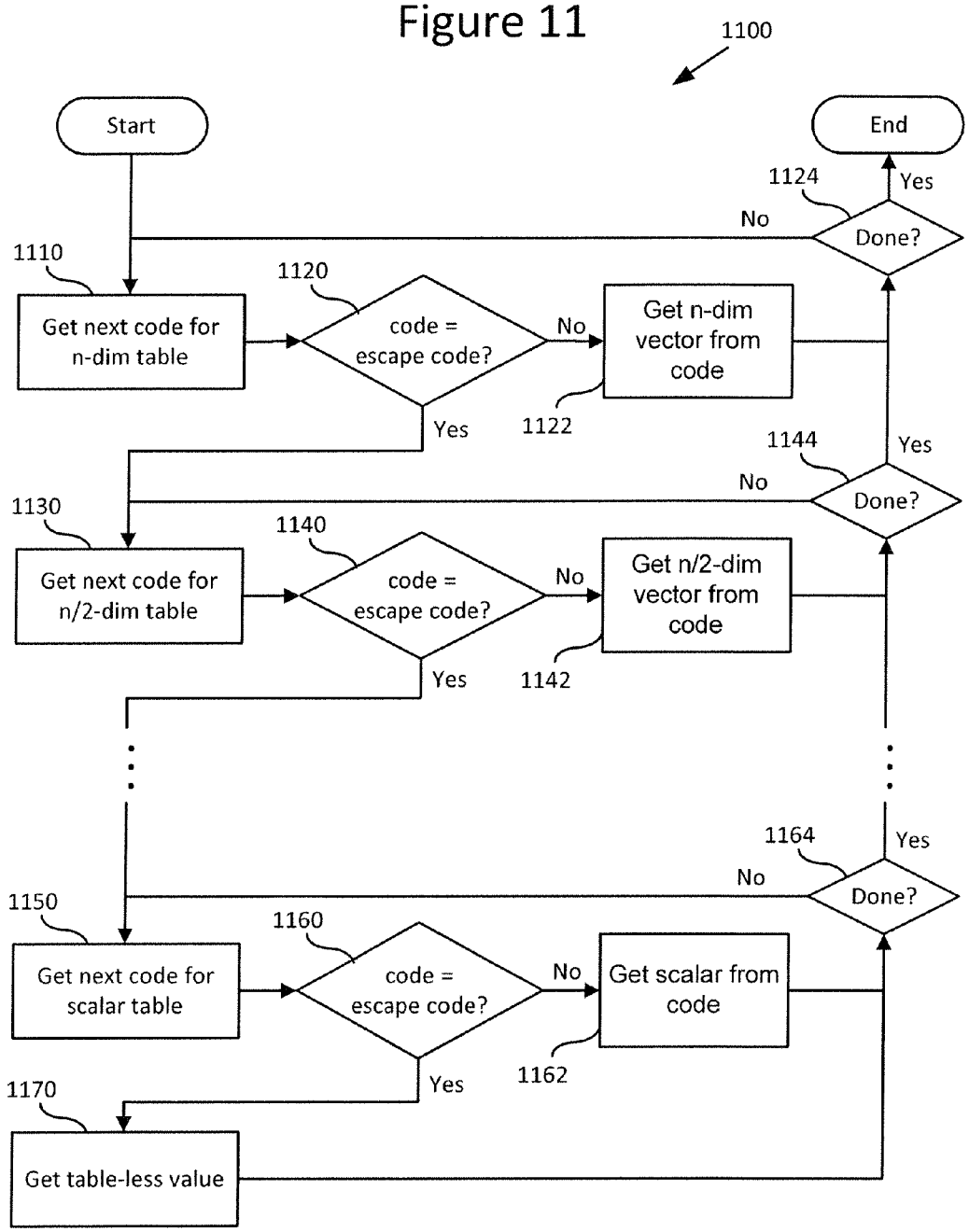
FIG. 11 is a flowchart showing a detailed technique for decoding vectors coded using variable-dimension vector Huffman encoding.

FIG. 11 shows a detailed technique (1100) for decoding vectors coded using VDVH encoding in one implementation. The decoding technique (1100) corresponds to the encoding technique (800) shown in FIG. 8.

Referring to FIG. 11, the decoder gets the next code for an n-dim vector Huffman code table (1110). The decoder checks if the code is the escape code for the n-dim vector Huffman code table (1120). If not, the decoder gets the n symbols represented by the code in the n-dim vector table (1122). The decoder continues until the decoder has finished processing the encoded data (1124).

If the code is the escape code for the n-dim vector Huffman code table, the decoder decodes the n-dim vector as two n/2-dim vectors using a n/2-dim vector Huffman code table. Specifically, the decoder gets the next code for the n/2-dim vector Huffman code table (1130). The decoder checks if the code is the escape code for the n/2-dim vector Huffman code table (1140). If not, the decoder gets the n/2 symbols represented by the code in the n/2-dim vector Huffman code table (1142). The decoder continues processing the codes for the n/2-dim vector Huffman code table until the processing of such codes is complete (1144).

If the code is the escape code for the n/2-dim vector Huffman code table, the decoder decodes the n/2-dim vector as two n/4-dim vectors, which may be scalars, etc.

The decoder generally follows this pattern of decoding larger-dimension vectors as two smaller-dimension vectors when escape codes are detected, until the vectors to be decoded are scalars (1-dim vectors). At that point, the decoder gets the next code for a scalar Huffman code table (1150). The decoder checks if the code is the escape code for the scalar Huffman code table (1160). If not, the decoder gets the scalar represented by the code in the scalar Huffman code table (1162). The decoder continues processing the codes for the scalars until processing of such codes is complete (1164). If the code is the escape code for the scalar Huffman code table, the scalar is coded using a table-less technique, and the decoder gets the value (1170).

Alternatively, the decoder uses tables with different dimension sizes and/or uses tables that split vectors in some way other than by power of 2 in VDVH decoding.

2. Adaptive Switching

Figure 12:
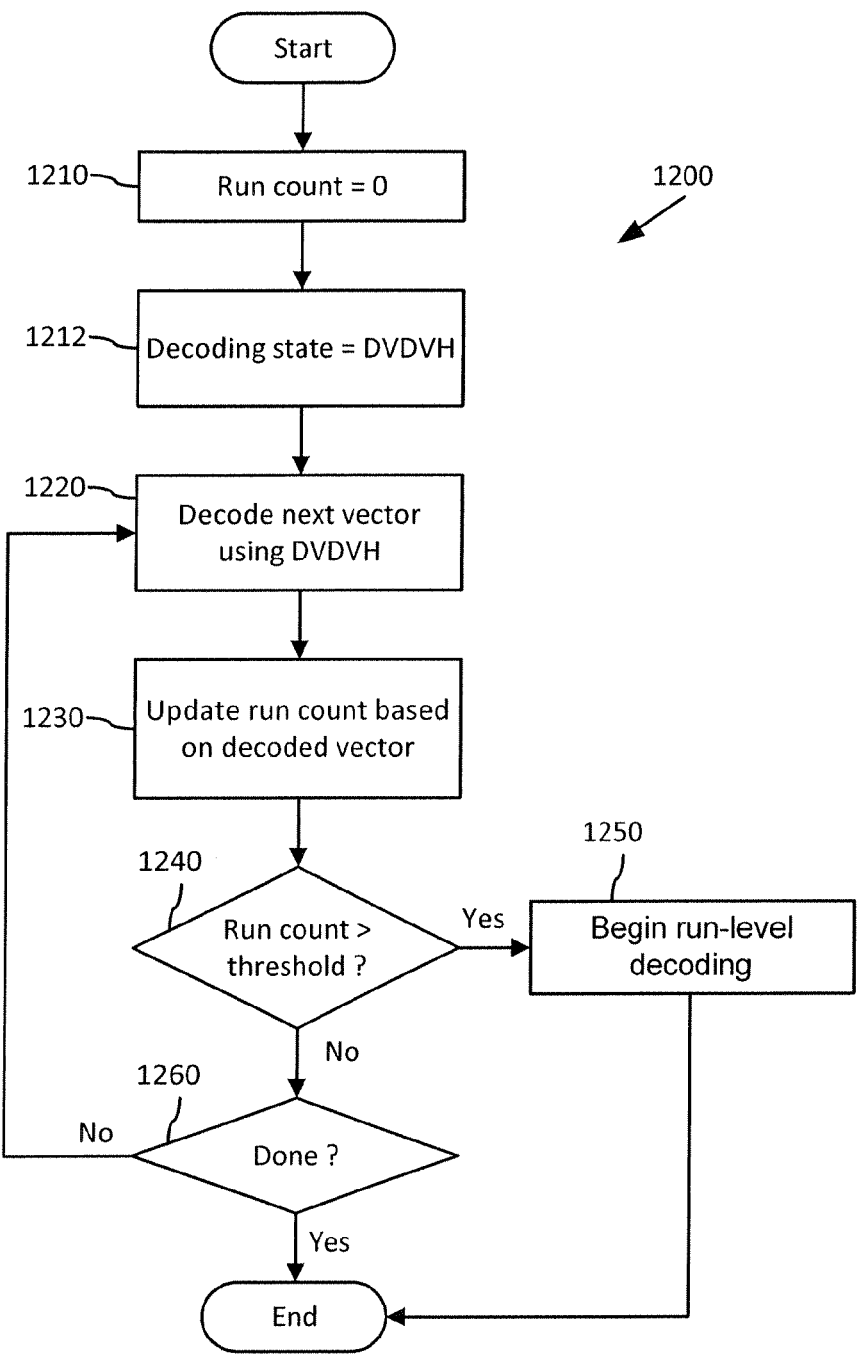
FIG. 12 is a flowchart showing a technique for variable-dimension vector Huffman decoding of direct signal levels where the decoder adaptively determines a switch point for changing to decoding of run lengths and signal levels.
Figure 13A:
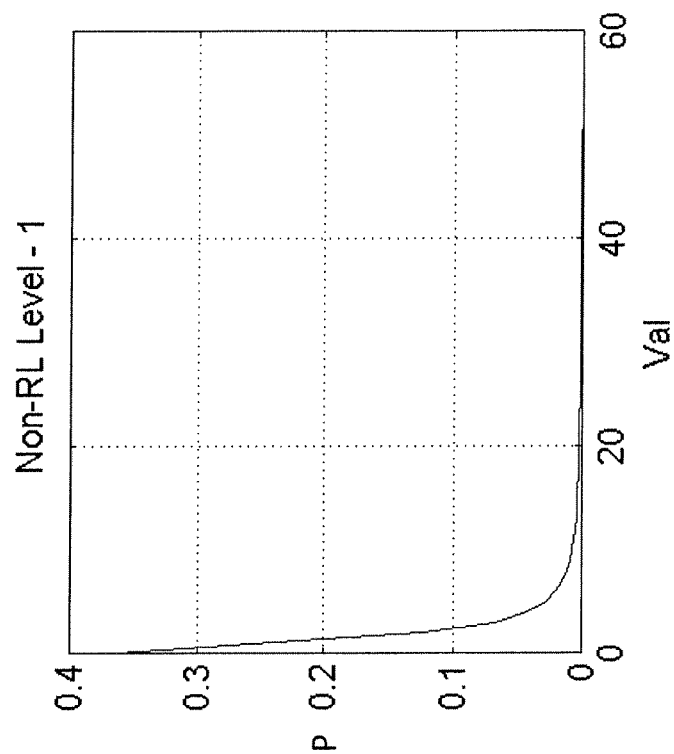
Figure 13B:
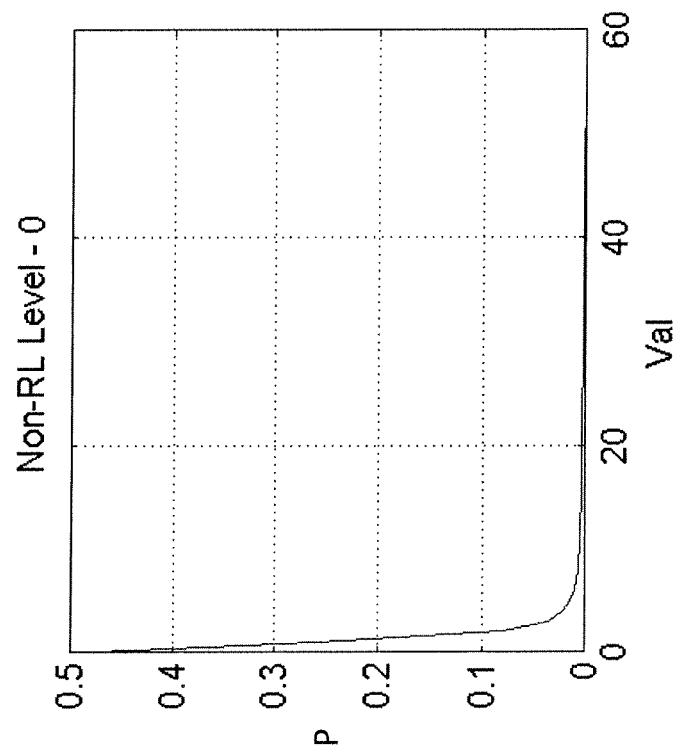
Figure 14A:
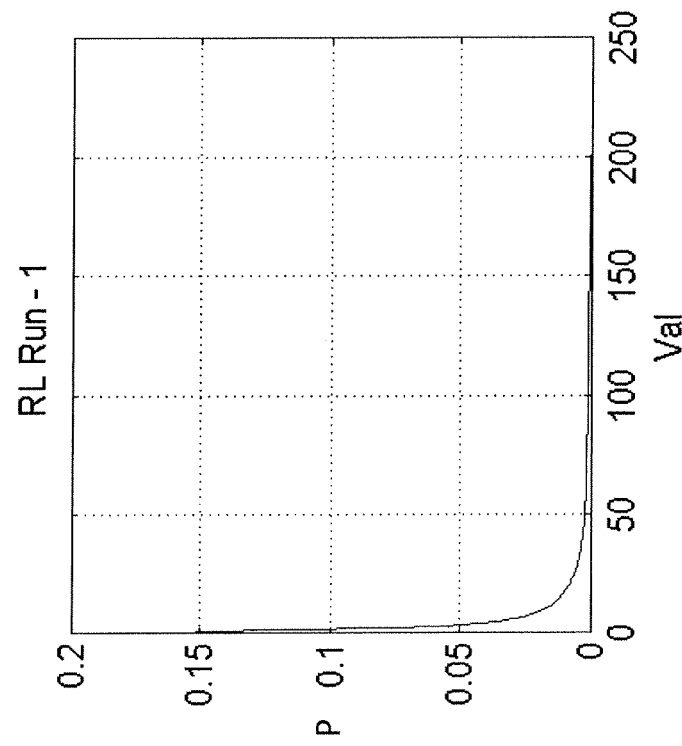
FIGS. 14A-14H are probability distributions for different run lengths in a context-based arithmetic encoding scheme.
Figure 14B:
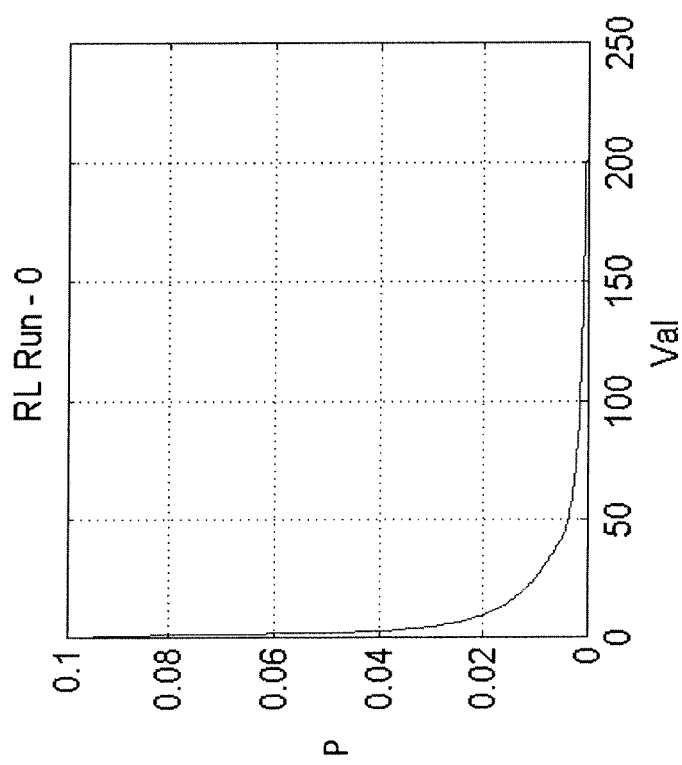
Figure 14C:
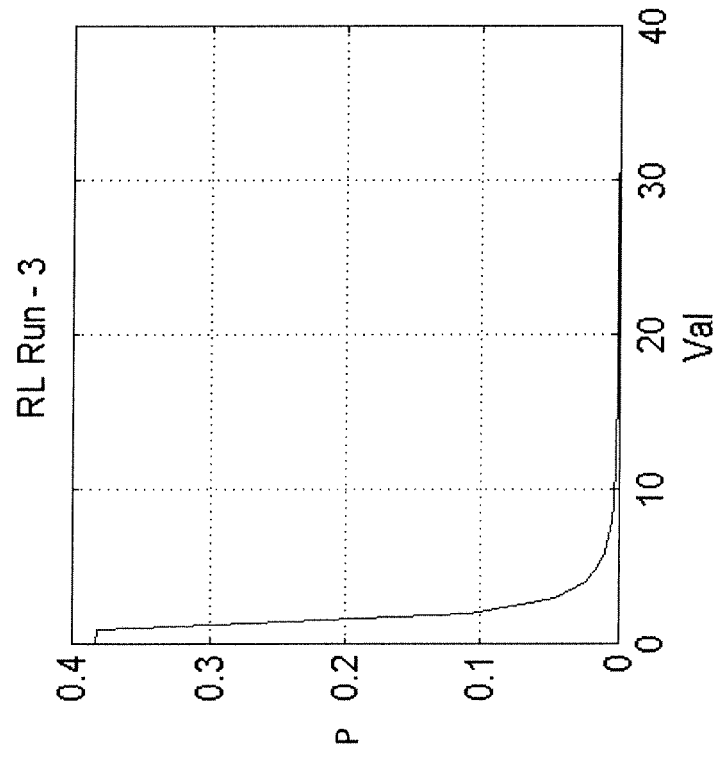
Figure 14D:
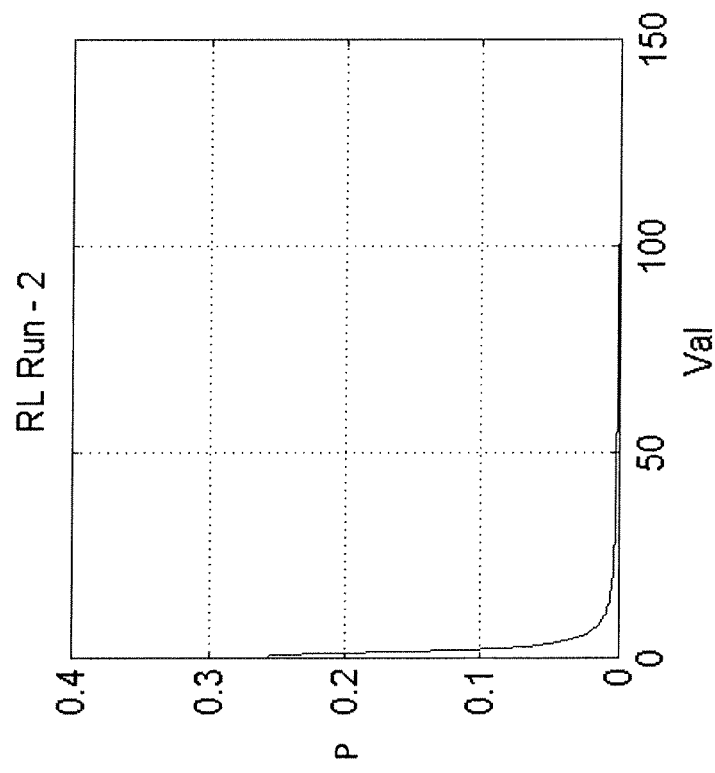
Figure 14E:
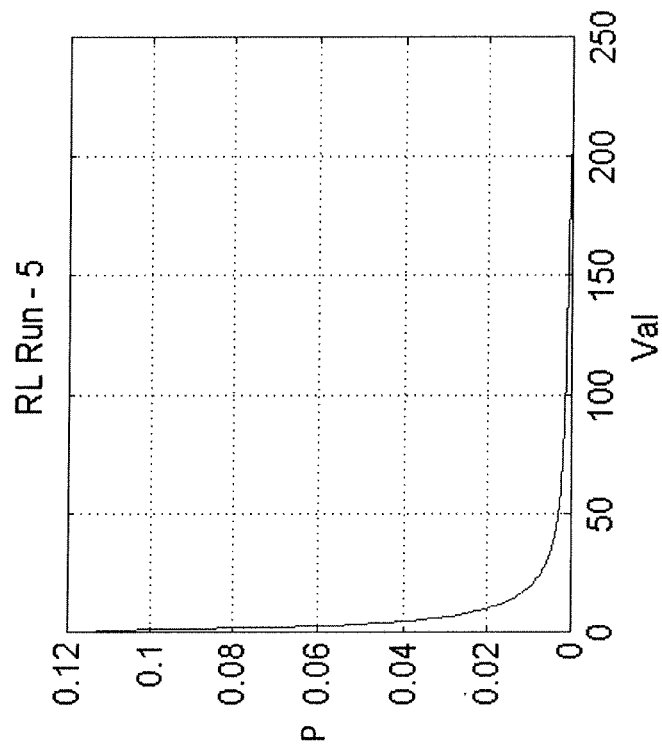
Figure 14F:
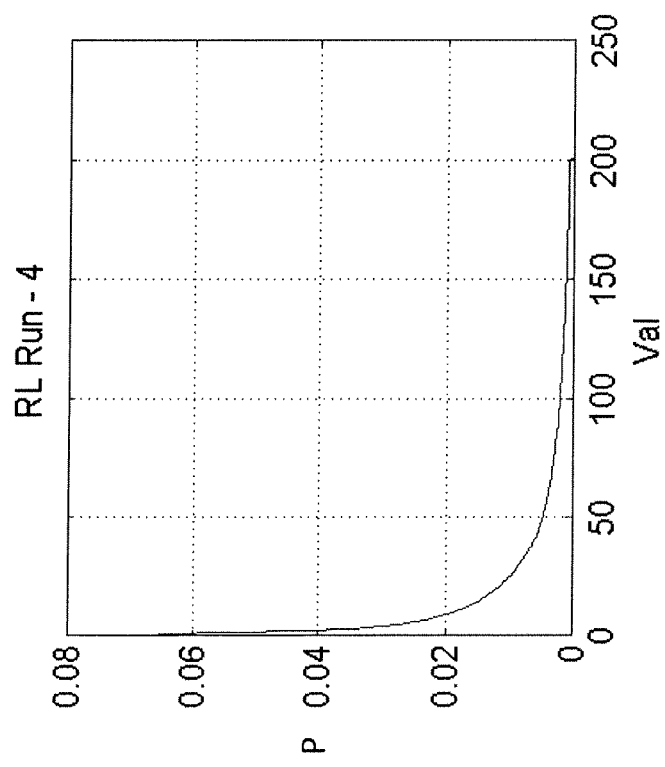
Figure 14G:
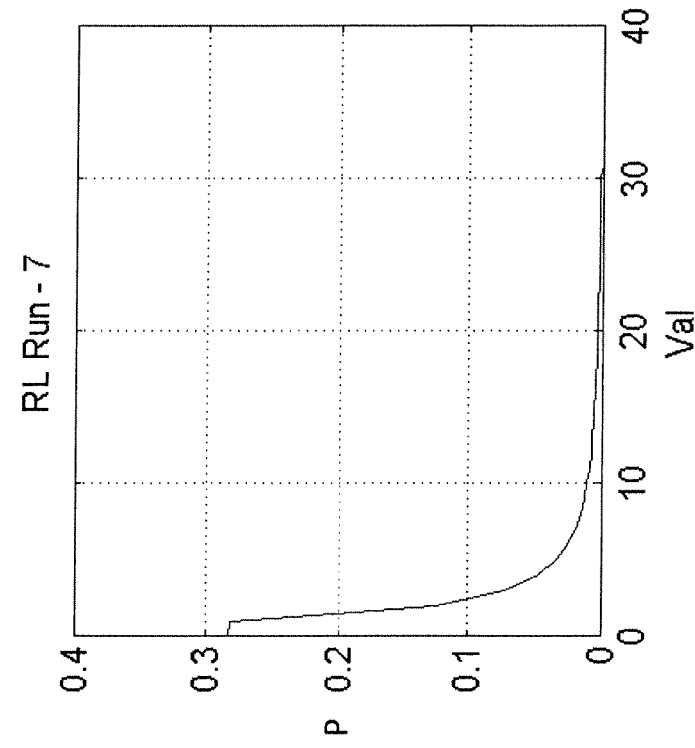
Figure 14H:
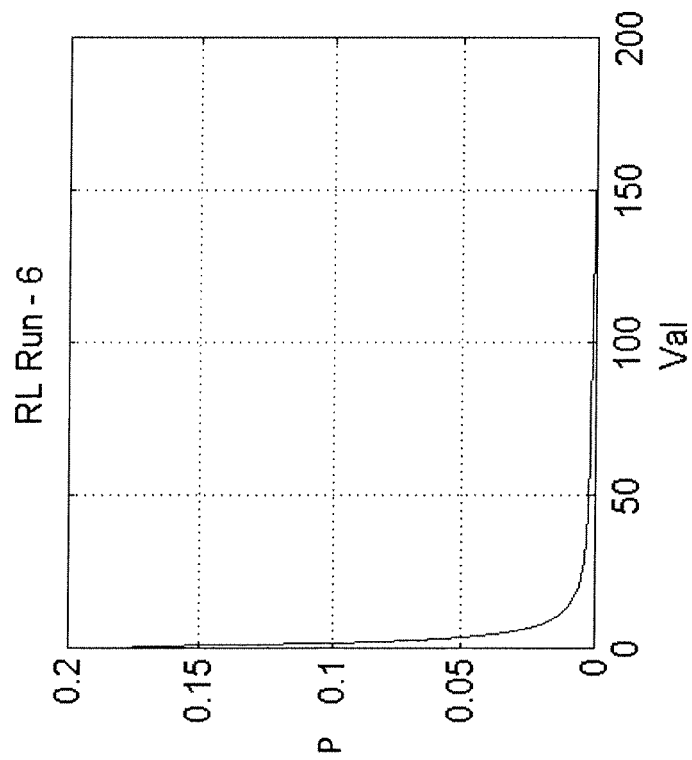
Figure 15B:
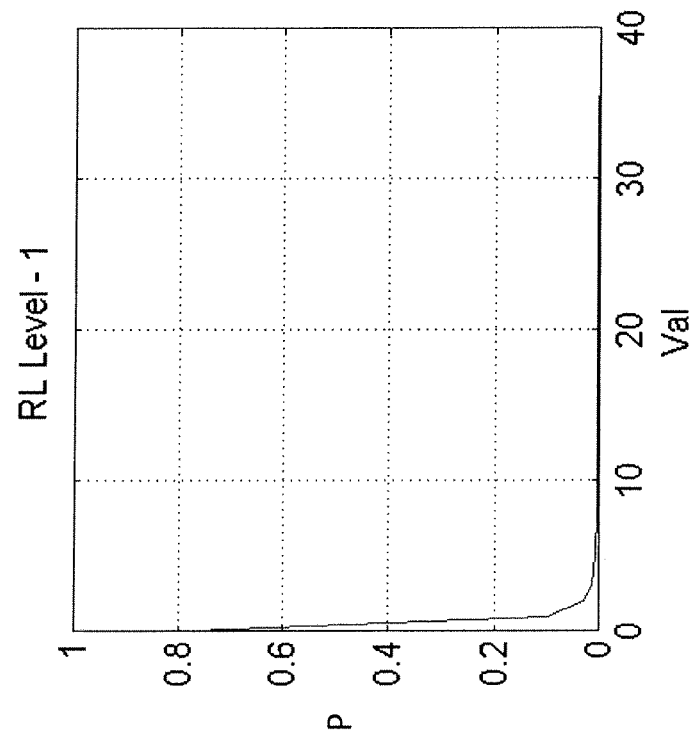
FIGS. 15A-15H are probability distributions for run-length encoded levels in a context-based arithmetic encoding scheme.
Figure 15A:
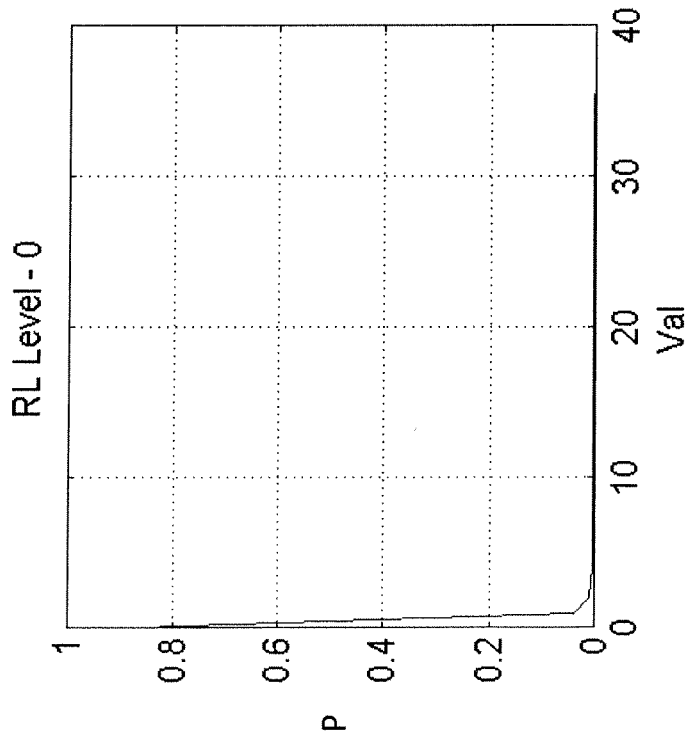
Figure 15C:
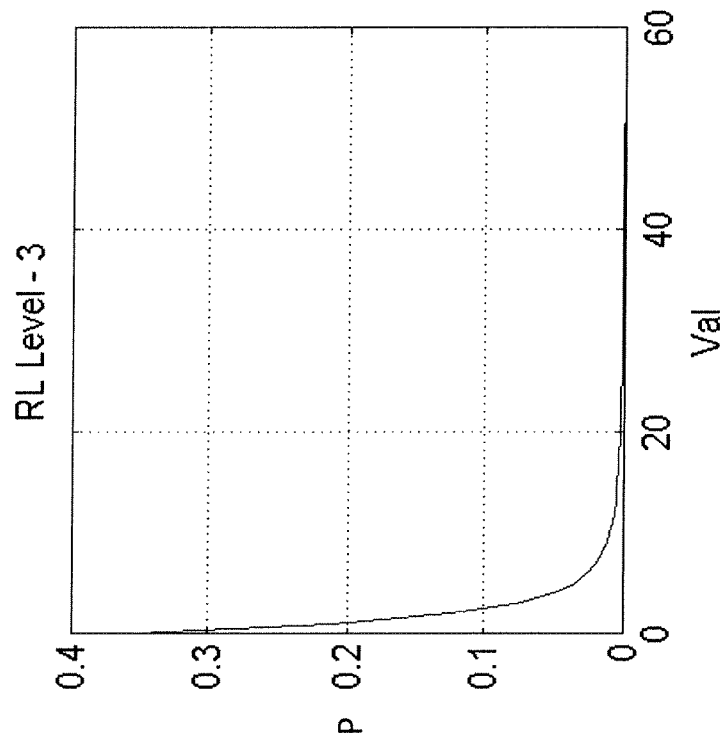
Figure 15D:
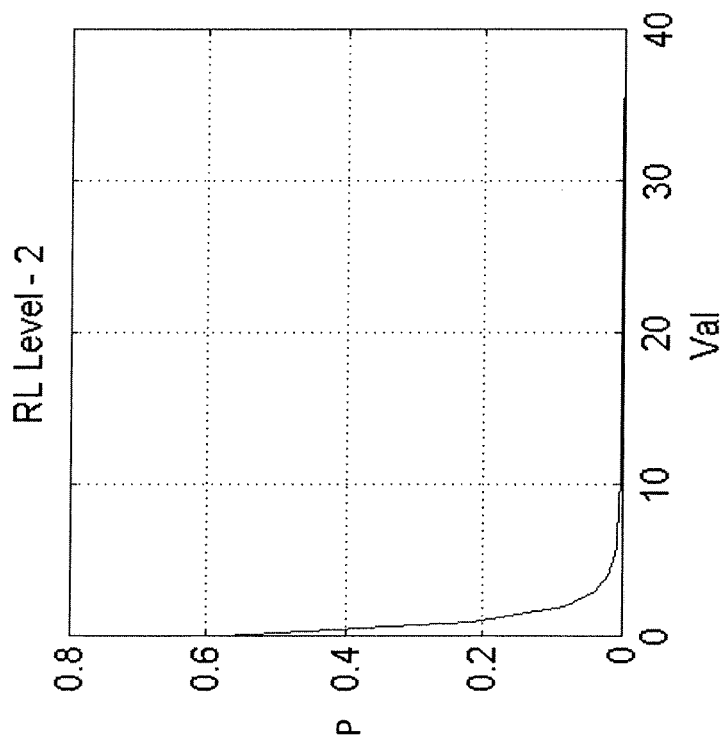
Figure 15E:
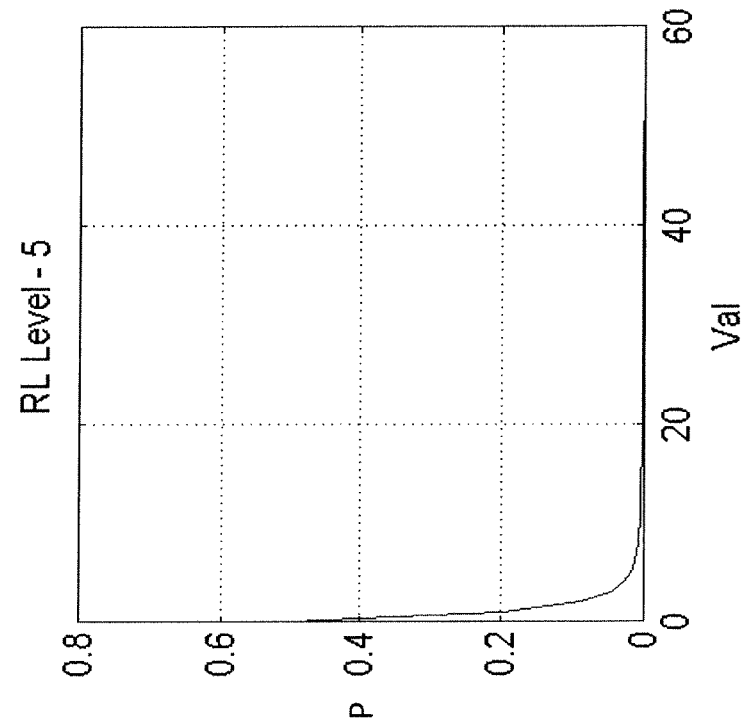
Figure 15F:
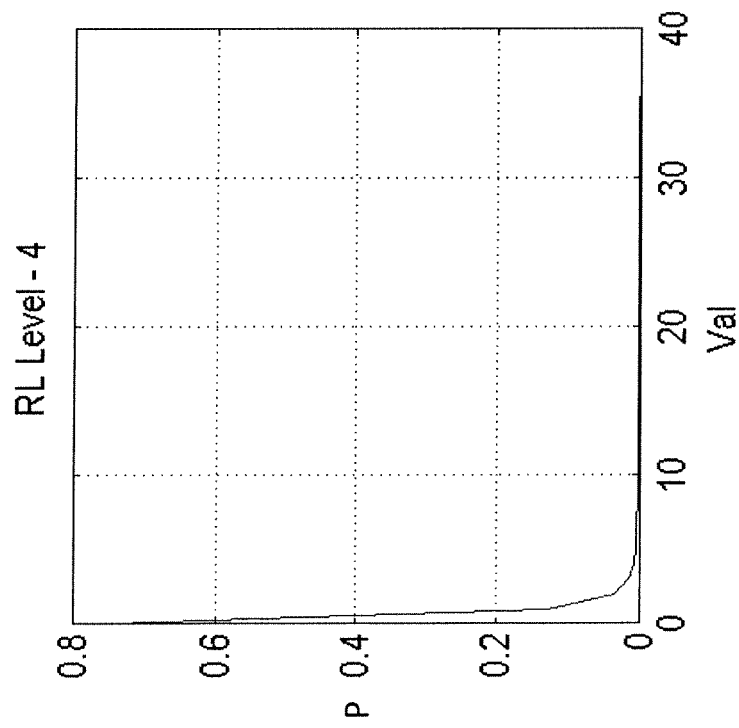
Figure 15H:
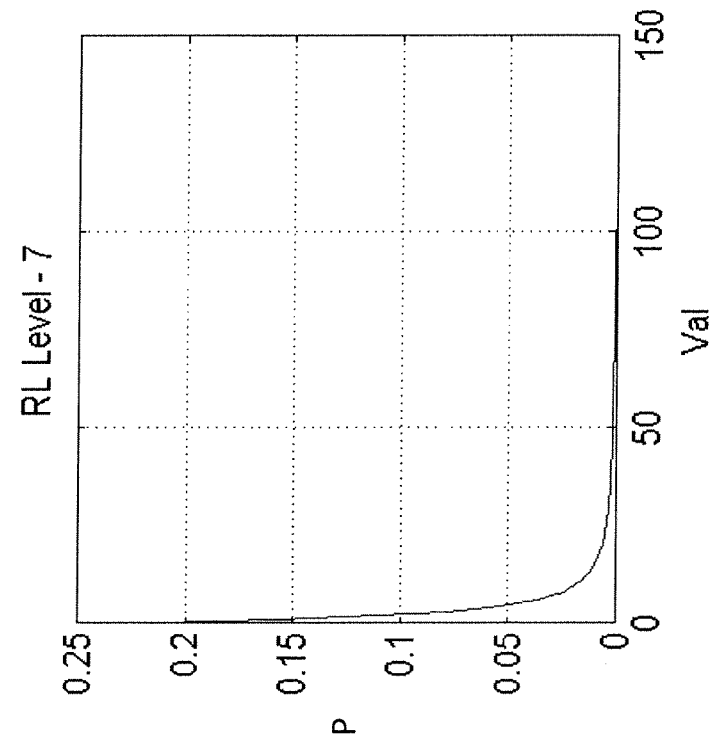
Figure 15G:
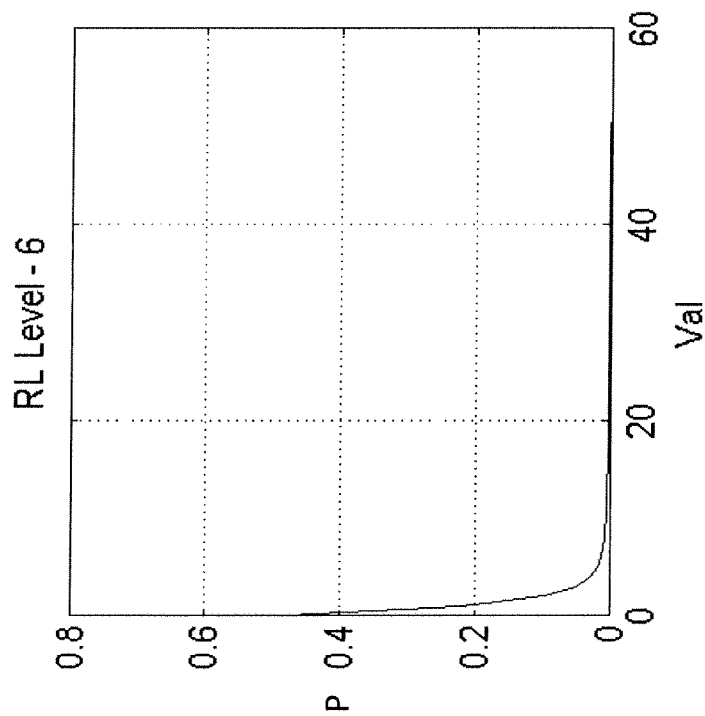

FIG. 12 shows a technique (1200) for decoding vectors encoded using VDVH encoding according to one implementation, where the decoder adaptively determines a switch point for changing to decoding of run lengths and signal levels. The adaptive switch point depends on a count of consecutive zero-value coefficients in the data, which are signal levels for quantized transform coefficients, progressing from the lowest-frequency coefficient to the highest-frequency coefficient. Alternatively, the data are another form and/or organization of audio data.

To start, the decoder initializes several variables. Specifically, the decoder sets a run count to 0 (1210) and sets a decoding state to DVDVH (1212).

The decoder decodes the next vector by looking up the code for that vector in a Huffman coding table (1220). For example, the decoder performs the decoding technique (1100) shown in FIG. 11. The decoder then updates the run count based on the decoded vector (1230) (specifically, using the number of zero values in the decoded vector to reset, increment, or otherwise adjust the run count).

The decoder checks if the run count exceeds a threshold (1240). The run count threshold can be static or it can depend on a factor such as the size of a block of coefficients (e.g., four zeroes in an input sequence of 256 coefficients), or it can be adaptive in some other way. If the run count exceeds the threshold, the decoder begins decoding the encoded coefficients using run-level decoding (1250). Run-level decoding can be performed in several ways, including, for example, Huffman decoding, vector Huffman decoding, or context-based arithmetic decoding.

In some embodiments, run-level decoding is performed using Huffman decoding with two potential Huffman code tables, where one table is used for decoding data in which shorter runs are more likely, and one table is used for decoding data in which longer runs are more likely. When the decoder receives a code, a signal bit in the code indicates which table the encoder used, and the decoder looks up the code in the appropriate table.

If the run count does not exceed the threshold, the decoder continues processing vectors until decoding is finished (1260).

V. Context-Based Arithmetic Coding and Decoding

In some embodiments, an encoder such as the encoder (200) of FIG. 2 uses context-based arithmetic ["CBA"] coding to code sequences of audio data. In CBA coding, different probability distributions for the input symbols are associated with different contexts. The probability distribution used to encode the input sequence changes when the context changes. The context can be calculated by measuring different factors that are expected to affect the probability of a particular input symbol appearing in an input sequence. A decoder such as the decoder (300) of FIG. 3 performs corresponding arithmetic decoding.

When encoding coefficients directly (i.e., as direct levels), the encoder uses factors including the values of the previous coefficients in the sequence to calculate the context. When encoding coefficients using run-level encoding, the encoder uses factors including the lengths of the current run and previous runs, in addition to the values of previous coefficients, to calculate the context. The encoder uses a probability distribution associated with the calculated context to determine the appropriate arithmetic code for the data. Thus, by using the various factors in calculating contexts, the encoder determines contexts adaptively with respect to the data and with respect to the mode (i.e., direct, run-level) of representation of the data.

In alternative embodiments, the encoder may use additional factors, may omit some factors, or may use the factors mentioned above in other combinations.

A. Example Implementation of Contexts

Tables 2-5 and FIGS. 13A-13D, 14A-14H, and 15A-15H show contexts and probability distributions, respectively, used in CBA encoding and decoding in an example implementation. Alternatively, CBA encoding and decoding use different contexts and/or different probability distributions.

Although the following discussion focuses on context calculation in the encoder in the example implementation, the decoder performs corresponding context calculation during decoding using previously decoded audio data.

As noted above, the encoder can encode coefficients using CBA encoding whether the encoder is coding direct levels only or run lengths and direct levels. In one implementation, however, the techniques for calculating contexts vary depending upon whether the encoder is coding direct levels only or run lengths and direct levels. In addition, when coding run lengths and direct levels, the encoder uses different contexts depending on whether the encoder is encoding a run length or a direct level.

The encoder uses a four-context system for calculating contexts during arithmetic encoding of direct levels using causal context. The encoder calculates the context for a current level L[n] based on the value of the previous level (L[n−1]) and the level just before the previous level (L[n−2]). This context calculation is based on the assumptions that 1) if previous levels are low, the current level is likely to be low, and 2) the two previous levels are likely to be better predictors of the current level than other levels. Table 2 shows the contexts associated with the values of the two previous levels in the four-context system. FIGS. 13A-13D show probability distributions for current levels for these contexts.

TABLE 2

Contexts for CBA encoding/decoding of direct levels

| L[n−1] | L[n−2] | Context |
| --- | --- | --- |
| =0 | =0 | 0 |
| =0 | ≥1 | 1 |
| =1 | Any | 2 |
| ≥2 | Any | 3 |

The probability distributions in FIGS. 13A-13D assume that when the two previous levels are zero or near-zero, the current level is more likely to be zero or near-zero.

The encoder also can use CBA coding when performing run-length coding of levels. When encoding a run length, factors used by the encoder to calculate context include the percentage of zeroes in the input sequence (a running total over part or all of the sequence) and the length of the previous run of zeroes (R[n−1]). The encoder calculates a zero percentage index based on the percentage of zeroes in the input sequence, as shown below in Table 3:

TABLE 3

Zero percentage indices for CBA encoding/decoding of run lengths

| Zero % | Zero % index |
| --- | --- |
| ≥90 | 0 |
| ≥80 | 1 |
| ≥60 | 2 |
| <60 | 3 |

The encoder uses the zero percentage index along with the length of the previous run to calculate the context for encoding the current run length, as shown below in Table 4. FIGS. 14A-14H show probability distributions for different run-length values associated with these contexts.

TABLE 4

Contexts for CBA encoding/decoding of run lengths

| Zero % index | R[n−1] | Context |
| --- | --- | --- |
| 0 | =0 | 0 |
| 0 | >0 | 4 |
| 1 | =0 | 1 |
| 1 | >0 | 5 |
| 2 | =0 | 2 |
| 2 | >0 | 6 |
| 3 | =0 | 3 |
| 3 | >0 | 7 |

For example, in an input sequence where 91% of the levels are zeroes (resulting in a zero percentage index of 0), and where the length of the previous run of zeroes was 15, the context is 4. The probability distributions in FIGS. 14A-14H show that when the percentage of zeroes in an input sequence is higher, longer run lengths are more likely. The probability distributions also assume that within a given zero percentage index, run lengths following a run length of zero are likely to be shorter than run lengths following a run length greater than zero.

When encoding a level in run-level data, factors used by the encoder to calculate context include the length of the current run (R[n]), the length of the previous run (R[n−1]), and the values of the two previous levels (L[n−1] and L([n−2]). This context calculation is based on the observation that the current level is dependent on the previous two levels as long as the spacing (i.e., run lengths) between the levels is not too large. Also, if previous levels are lower, and if previous runs are shorter, the current level is likely to be low. When previous runs are longer, the previous level has less effect on the current level.

The contexts associated with the values of the current run length, previous run length, and the two previous levels are shown below in Table 5. FIGS. 15A-15H show probability distributions for levels associated with these contexts.

TABLE 5

Contexts for CBA encoding/decoding of levels in run-level encoding

| R[n] | R[n-1] | L[n-1] | L[n-2] | Context |
|---|---|---|---|---|
| ≥2 | Any | Any | Any | 0 |
| <2 | ≥2 | =1 | Any | 1 |
| <2 | ≥2 | =2 | Any | 2 |
| <2 | ≥2 | >2 | Any | 3 |
| <2 | <2 | =1 | =1 | 4 |
| <2 | <2 | =1 | >1 | 5 |
| <2 | <2 | =2 | Any | 6 |
| <2 | <2 | >2 | Any | 7 |

For example, in an input sequence where the length of the current run of zeroes is 1, the length of the previous run of zeroes is 2, and the previous level is 1, the context is 1. The probability distributions in FIGS. 15A-15H show that when the previous levels are lower, and when current and previous run lengths are shorter, the current level is more likely to be zero or near zero.

B. Adaptive Switching

Figure 16:
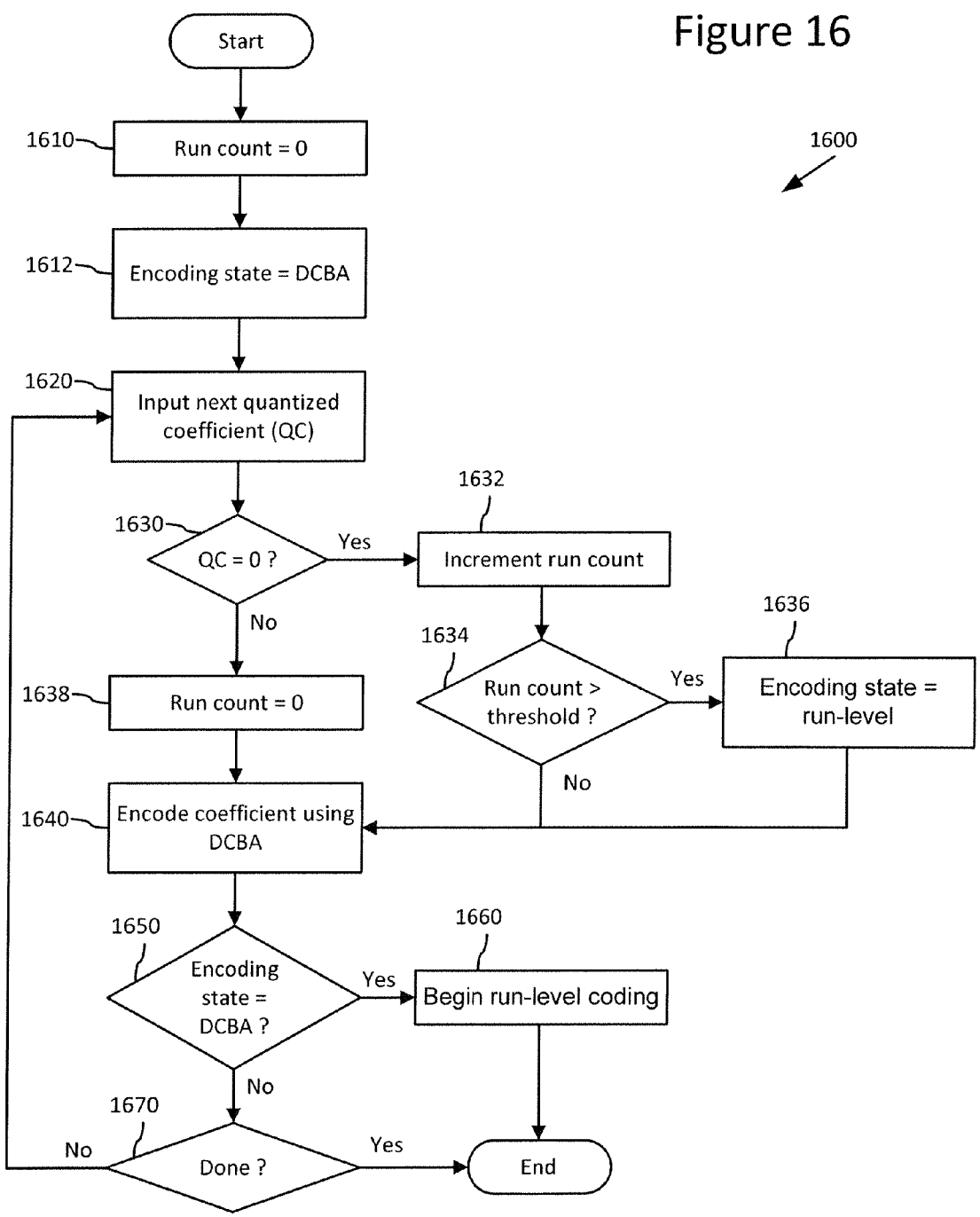
FIG. 16 is a flowchart showing a technique for direct context-based arithmetic coding of coefficients where a switch point for changing to coding of run lengths and levels is determined adaptively by the encoder.

FIG. 16 shows a technique (1600) for CBA coding of coefficients of direct signal levels where the encoder adaptively determines a switch point for changing to coding of run lengths and signal levels according to one implementation. The adaptive switch point depends on a count of consecutive zero-value coefficients. The input data are signal levels for quantized transform coefficients, progressing from the lowest-frequency coefficient to the highest-frequency coefficient. Alternatively, the input data are another form and/or organization of audio data.

To start, the encoder initializes several variables. Specifically, the encoder sets a run count variable to 0 (1610) and sets an encoding state variable to direct context-based arithmetic (DCBA) (1612).

The encoder receives the next coefficient QC as input (1620). The encoder then checks (1630) if the coefficient is zero. If the coefficient QC is non-zero, the encoder resets the run count (1638) and codes the coefficient using DCBA encoding (1640).

Otherwise (i.e., if the coefficient QC is zero), the encoder increments the run count variable (1632), and checks to see whether the current run count exceeds the run count threshold (1634). The run count threshold can be static or it can depend on a factor such as the size of a block of coefficients (e.g., four zeroes in an input sequence of 256 coefficients), or it can be adaptive in some other way. For example, the threshold may be increased or decreased, with or without regard to the number of coefficients in an input sequence. If the run count exceeds the threshold, the encoder changes the encoding state to run-level encoding ["RLE"] (1636). The encoder then codes the coefficient using DCBA encoding (1640).

After encoding the coefficient, the encoder checks the encoding state (1650). If the encoding state is no longer DCBA (e.g., if the encoder has changed the encoding state to RLE as a result of exceeding a threshold number of zero coefficients), the encoder begins encoding of the coefficients as run lengths and levels (1660). Run-level encoding can be performed in several ways, including, for example, Huffman coding, vector Huffman coding, or CBA coding (potentially with different contexts than the earlier CBA coding, as described above). In some embodiments, run-level encoding is performed using Huffman coding with two Huffman code tables, where one table is used for encoding data in which shorter runs are more likely, and one table is used for encoding data in which longer runs are more likely. The encoder tries each table, and chooses codes from one of the tables, with a signal bit indicating which table the encoder used.

If the encoding state has not changed, the encoder determines (1670) whether there are any more coefficients to be encoded. If so, the encoder inputs the next coefficient (1620) and continues the encoding process.

C. Context-Based Arithmetic Decoding

Figure 17:
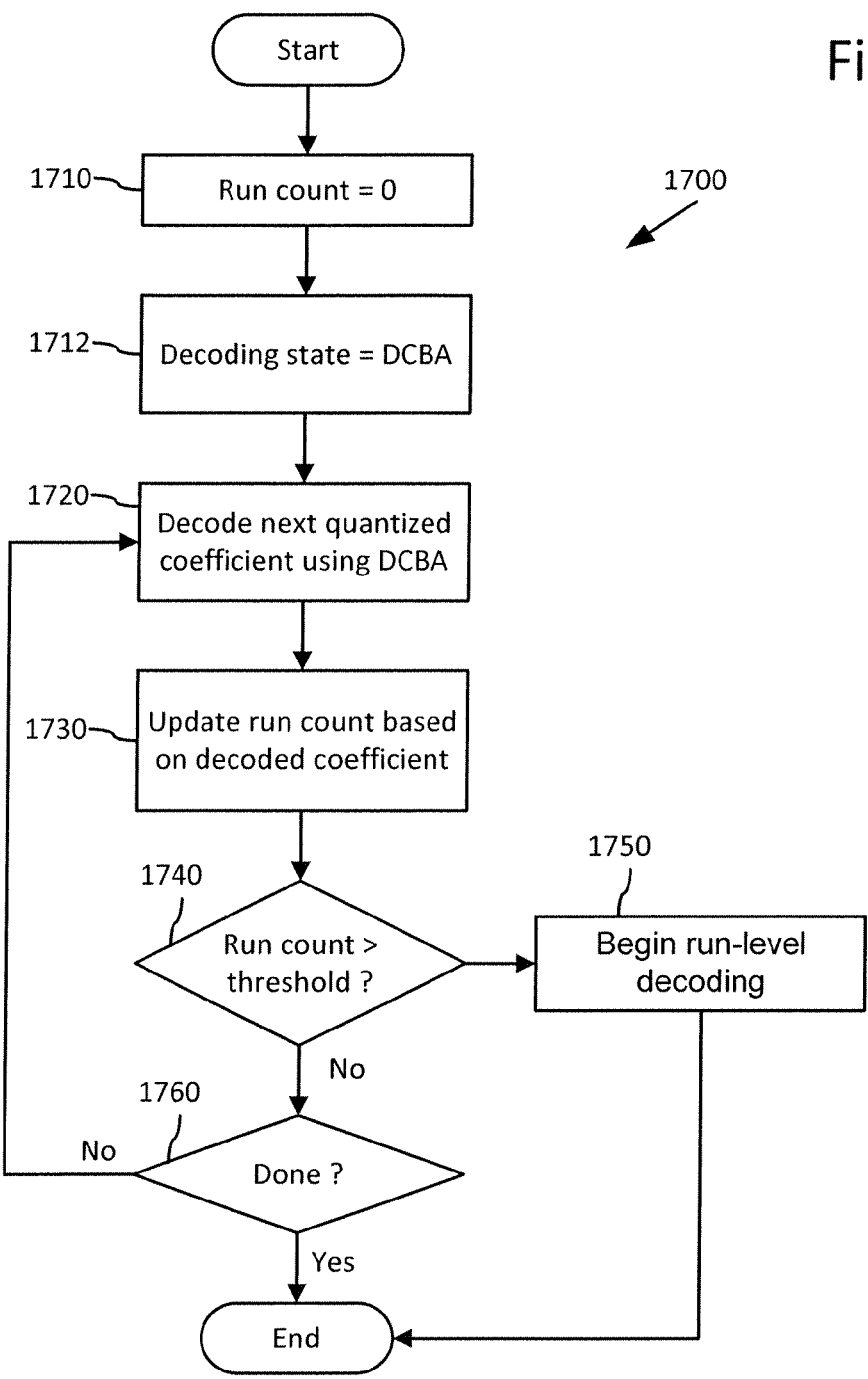
FIG. 17 is a flowchart showing a technique for context-based arithmetic decoding where the decoder adaptively determines a switch point for changing to decoding of run lengths and signal levels.

FIG. 17 shows a technique (1700) for decoding coefficients encoded using CBA encoding according to one implementation, where the decoder adaptively determines a switch point for changing to decoding of run lengths and signal levels. The adaptive switch point depends on a count of consecutive zero-value coefficients in the data, which are signal levels for quantized transform coefficients, progressing from the lowest-frequency coefficient to the highest-frequency coefficient. Alternatively, the data are another form and/or organization of audio data.

To start, the decoder initializes several variables. Specifically, the decoder sets a run count to 0 (1710) and sets a decoding state to direct context-based arithmetic (DCBA) (1712).

The decoder decodes the next quantized coefficient using DCBA (1720) by looking at the number the encoder used to represent the coefficient in arithmetic encoding, and extracting the value of the coefficient from that number. The decoder then updates the run count based on the decoded coefficient (1730) (specifically, based on whether the decoded coefficient is a zero value to reset or increment the run count).

The decoder checks if the run count exceeds a threshold (1740). The run count threshold can be static or it can depend on a factor such as the size of a block of coefficients (e.g., four zeroes in an input sequence of 256 coefficients), or it can be adaptive in some other way. If the run count exceeds the threshold, the decoder begins decoding the encoded coefficients using run-level decoding (1750). Run-level decoding can be performed in several ways, including, for example, Huffman decoding, vector Huffman decoding, or CBA decoding (potentially with different contexts than the earlier CBA decoding, as described above). In some embodiments, run-level decoding is performed using Huffman decoding with two potential Huffman code tables, where one table is used for decoding data in which shorter runs are more likely, and one table is used for decoding data in which longer runs are more likely. When the decoder receives a code, a signal bit in the code indicates which table the encoder used, and the decoder looks up the code in the appropriate table.

If the run count does not exceed the threshold, the decoder continues processing coefficients until decoding is finished (1760).

VI. Table-Less Coding

In some embodiments using Huffman coding, an encoder such as the encoder (200) of FIG. 2 uses an escape code for a Huffman code table to indicate that a particular symbol (or combination of symbols) does not have an associated code in the table. Sometimes, an escape code is used to indicate that a particular symbol (e.g., a scalar value for a level that is not represented in a scalar Huffman code table for levels, a run length that is not represented in a scalar Huffman code table for run lengths, etc.) is to be encoded without using a code from a Huffman table. In other words, the symbol is to be encoded using a "table-less" coding technique.

In some embodiments using arithmetic coding, an escape code is sometimes used to indicate that a particular symbol is not to be coded arithmetically. The symbol could be encoded using a code from a Huffman table, or it could also be encoded using a "table-less" encoding technique.

Some table-less coding techniques use fixed-length codes to represent symbols. However, using fixed-length codes can lead to unnecessarily long codes.

In some embodiments, therefore, symbols such as quantized transform coefficients are represented with variable length codes in a table-less encoding technique when the symbols are not otherwise encoded. A decoder such as the decoder (300) of FIG. 3 performs a corresponding table-less decoding technique.

For example, Table 6 shows pseudo-code for one implementation of such a table-less encoding technique.

TABLE 6

Pseudo-code for table-less coding technique in one implementation

```
If (value < 2^8) {
    Send "0";
    Send value using 8 bits;
}
    else if (value < 2^16) {
        Send "10";
        Send value using 16 bits
    }
        else if (value < 2^24) {
            Send "110";
            Send value using 24 bits;
        }
            else if (value < 2^31) {
                Send "111";
                Send value using 31 bits;
            }
```

The number of bits the encoder uses to encode the coefficient depends on the value of the coefficient. The encoder sends a one, two, or three-bit value to indicate the number of bits used to encode the value, and then sends the encoded value itself using 8, 16, 24 or 31 bits. The total number of bits the encoder uses to encode the coefficient ranges from 9 bits for a value less than $2^8$ to 34 bits for a value greater than or equal to $2^{24}$, but less than $2^{31}$.

For a series of coefficients, the average bits sent will be equal to:

$$P(0 \leq C < 2^8)*9 + P(2^8 \leq C < 2^{16})*18 + P(2^{16} \leq C < 2^{24})*27 + P(2^{24} \leq C < 2^{31})*34,$$

where $P(m \leq C < n)$ is the probability of occurrence in an input sequence of a coefficient C within the range indicated. Significant bit savings are therefore possible when a large percentage of coefficients are small (e.g., less than $2^{16}$).

Alternatively, the encoder and decoder use another table-less encoding/decoding technique.

Having described and illustrated the principles of our invention with reference to various described embodiments, it will be recognized that the described embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of the described embodiments shown in software may be implemented in hardware and vice versa.

In view of the many possible embodiments to which the principles of our invention may be applied, we claim as our invention all such embodiments as may come within the scope and spirit of the following claims and equivalents thereto.

We claim:

1. A computer-readable memory or storage device storing computer-executable instructions for causing a computing device that implements an encoder to perform a method of encoding audio or video data, the method comprising:
    performing a frequency transform on a block of plural samples to produce plural transform coefficients;
    quantizing the plural transform coefficients; and
    entropy coding the plural quantized transform coefficients, wherein the entropy coding includes:
        encoding one or more of the plural quantized transform coefficients using a direct level encoding mode, including performing first context-adaptive arithmetic coding of a level value of a given coefficient of the plural quantized transform coefficients, wherein the first context-adaptive arithmetic coding uses a first set of plural contexts, and wherein the first context-adaptive arithmetic coding includes selecting one of the first set of plural contexts based at least in part on level values of two previously encoded quantized transform coefficients;
        switching to a run-level encoding mode for remaining coefficients of the plural quantized transform coefficients;
        encoding the remaining quantized transform coefficients using the run-level encoding mode, including:
            performing second context-adaptive arithmetic coding of a non-zero level value of one of the remaining quantized transform coefficients, wherein the second context-adaptive arithmetic coding uses a second set of plural contexts different than the first set of plural contexts, and wherein the second context-adaptive arithmetic coding includes selecting one of the second set of plural contexts based at least in part on a level value of a previously encoded quantized transform coefficient; and
            performing third context-adaptive arithmetic coding of a run value, the run value indicating a count of consecutive zero-value remaining quantized transform coefficients adjacent the remaining quantized transform coefficient with the non-zero level value, wherein the third context-adaptive arithmetic coding uses a third set of plural contexts different than the first set of plural contexts and different than the second set of plural contexts.

2. The computer-readable memory or storage device of claim 1 wherein the entropy coding further includes:
    selecting the first context-adaptive arithmetic coding from among multiple encoding techniques available for the direct level encoding mode, wherein the multiple encoding techniques available for the direct level encoding mode further include variable length coding of level values; and
    selecting the second context-adaptive arithmetic coding and the third context-adaptive arithmetic coding from among multiple encoding techniques available for the run-level encoding mode, wherein the multiple encoding techniques available for the run-level encoding mode further include variable length coding of run values and level values.

3. The computer-readable memory or storage device of claim 1 wherein the switching from the direct level encoding mode to the run-level encoding mode happens at a pre-determined switch point.

4. The computer-readable memory or storage device of claim 1 wherein the selected context from the first set of plural contexts changes depending on (1) whether the level value of a first of the two previously encoded quantized transform coefficients is zero or non-zero and (2) whether the level value of a second of the two previously encoded quantized transform coefficients is zero or non-zero.

5. The computer-readable memory or storage device of claim 1 wherein the encoding the remaining ones of the plural quantized transform coefficients using the run-level encoding mode includes repeating the second context-adaptive arithmetic coding and the third context-adaptive arithmetic coding for each of one or more other pairs of non-zero level value and run value.

6. The computer-readable memory or storage device of claim 5 wherein:
for a first non-zero level value in the run-level encoding mode, the selection of one of the second set of plural contexts considers the level value of the given quantized transform coefficient from the direct level encoding mode; and
for a subsequent non-zero level value in the run-level encoding mode, the selection of one of the second set of plural contexts considers the first non-zero level value.

7. A computer-readable memory or storage device storing computer-executable instructions for causing a computing device that implements a decoder to perform a method of decoding audio or video data, the method comprising:
entropy decoding plural quantized transform coefficients in a block, wherein the entropy decoding the encoded information includes:
decoding one or more of the plural quantized transform coefficients using a direct level decoding mode, including performing first context-adaptive arithmetic decoding of a level value of a given coefficient of the plural quantized transform coefficients, wherein the first context-adaptive arithmetic decoding uses a first set of plural contexts, and wherein the first context-adaptive arithmetic decoding includes selecting one of the first set of plural contexts based at least in part on level values of two previously decoded quantized transform coefficients;
switching to a run-level decoding mode for remaining coefficients of the plural quantized transform coefficients in the block;
decoding the remaining quantized transform coefficients using the run-level decoding mode, including:
performing second context-adaptive arithmetic decoding of a non-zero level value of one of the remaining quantized transform coefficients, wherein the second context-adaptive arithmetic decoding uses a second set of plural contexts different than the first set of plural contexts, and wherein the second context-adaptive arithmetic decoding includes selecting one of the second set of plural contexts based at least in part on a level value of a previously decoded quantized transform coefficient; and
performing third context-adaptive arithmetic decoding of a run value, the run value indicating a count of consecutive zero-value remaining quantized transform coefficients adjacent the remaining quantized transform coefficient with the non-zero level value, wherein the third context-adaptive arithmetic decoding uses a third set of plural contexts different than the first set of plural contexts and different than the second set of plural contexts; and
inverse quantizing the plural transform coefficients in the block; and
performing an inverse frequency transform on the plural transform coefficients to produce a block of the plural samples.

8. The computer-readable memory or storage device of claim 7 wherein the entropy decoding further includes:
selecting the first context-adaptive arithmetic decoding from among multiple decoding techniques available for the direct level decoding mode, wherein the multiple decoding techniques available for the direct level decoding mode further include variable length decoding of level values; and
selecting the second context-adaptive arithmetic decoding and the third context-adaptive arithmetic decoding from among multiple decoding techniques available for the run-level decoding mode, wherein the multiple decoding techniques available for the run-level decoding mode further include variable length decoding of run values and level values.

9. The computer-readable memory or storage device of claim 7 wherein the switching from the direct level decoding mode to the run-level decoding mode happens at a pre-determined switch point.

10. The computer-readable memory or storage device of claim 7 wherein the selected context from the first set of plural contexts changes depending on (1) whether the level value of a first of the two previously decoded quantized transform coefficients is zero or non-zero and (2) whether the level value of a second of the two previously decoded quantized transform coefficients is zero or non-zero.

11. The computer-readable memory or storage device of claim 7 wherein the decoding the remaining ones of the plural quantized transform coefficients using the run-level decoding mode includes repeating the second context-adaptive arithmetic decoding and the third context-adaptive arithmetic decoding for each of one or more other pairs of non-zero level value and run value.

12. The computer-readable memory or storage device of claim 11 wherein:
for a first non-zero level value in the run-level decoding mode, the selection of one of the second set of plural contexts considers the level value of the given quantized transform coefficient from the direct level decoding mode; and
for a subsequent non-zero level value in the run-level decoding mode, the selection of one of the second set of plural contexts considers the first non-zero level value.

13. A computing device that implements a decoder, the computing device comprising:
one or more processors;
memory; and
one or more storage media storing instructions for causing the computing device to perform a method of decoding audio or video data, the method comprising:
entropy decoding plural quantized transform coefficients in a block, wherein the entropy decoding includes:
decoding one or more of the plural quantized transform coefficients using a first decoding mode, including performing first context-adaptive arithmetic decoding of a level value of a given coefficient of the plural quantized transform coefficients, wherein the first context-adaptive arithmetic decoding uses a first set of plural contexts, and wherein the first context-adaptive arithmetic decoding includes selecting one of the first set of plural contexts based at least in part on level values of two previously decoded quantized transform coefficients;

switching to a second decoding mode for remaining coefficients of the plural quantized transform coefficients in the block; and decoding the remaining quantized transform coefficients using the second decoding mode, including:

performing second context-adaptive arithmetic decoding of a first level value and a second level value of a first remaining coefficient and second remaining coefficient, respectively, of the remaining quantized transform coefficients, wherein the second context-adaptive arithmetic decoding uses a second set of plural contexts different than the first set of plural contexts, and wherein:

for the first level value in the second decoding mode, the selection of one of the second set of plural contexts considers the level value of the given quantized transform coefficient from the first decoding mode; and for the second level value in the second decoding mode, the selection of one of the second set of plural contexts considers the first level value; and inverse quantizing the plural transform coefficients in the block; and performing an inverse frequency transform on the plural transform coefficients to produce on a block of the plural samples.

14. The computing device of claim 13 wherein the first decoding mode is a direct level decoding mode, wherein the second decoding mode is a run-level decoding mode, and wherein the decoding the remaining coefficients using the second decoding mode further includes:

performing third context-adaptive arithmetic decoding of a run value, the run value indicating a count of consecutive zero-value remaining quantized transform coefficients adjacent the first or second level value in the second decoding mode, wherein the third context-adaptive arithmetic decoding uses a third set of plural contexts different than the first set of plural contexts and different than the second set of plural contexts.

15. The computing device of claim 14 wherein the entropy decoding further includes:

selecting the first context-adaptive arithmetic decoding from among multiple decoding techniques available for the direct level decoding mode, wherein the multiple decoding techniques available for the direct level decoding mode further include variable length decoding of level values; and selecting the second context-adaptive arithmetic decoding and the third context-adaptive arithmetic decoding from among multiple decoding techniques available for the run-level decoding mode, wherein the multiple decoding techniques available for the run-level decoding mode further include variable length decoding of run values and level values.

16. The computing device of claim 13 wherein the switching from the direct level decoding mode to the run-level decoding mode happens at a pre-determined switch point.

17. The computing device of claim 13 wherein the selected context from the first set of plural contexts changes depending on (1) whether the level value of a first of the two previously decoded quantized transform coefficients is zero or non-zero and (2) whether the level value of a second of the two previously decoded quantized transform coefficients is zero or non-zero.

18. The computing device of claim 13 wherein the computing device includes a display and a wireless communication connection, and wherein the method further comprises receiving, over the wireless communication connection, a bit stream comprising the audio or video data.

* * * * *